(12) United States Patent
Kitagawa et al.

(10) Patent No.: US 11,581,701 B2
(45) Date of Patent: Feb. 14, 2023

(54) NITRIDE SEMICONDUCTOR LASER ELEMENT AND ILLUMINATION LIGHT SOURCE MODULE

(71) Applicant: Panasonic Semiconductor Solutions Co., Ltd., Kyoto (JP)

(72) Inventors: Hideo Kitagawa, Toyama (JP); Shinji Yoshida, Toyama (JP); Isao Kidoguchi, Hyogo (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 52 days.

(21) Appl. No.: 16/992,258

(22) Filed: Aug. 13, 2020

(65) Prior Publication Data

US 2020/0373730 A1 Nov. 26, 2020

Related U.S. Application Data

(63) Continuation of application No. PCT/JP2018/041524, filed on Nov. 8, 2018.

(30) Foreign Application Priority Data

Feb. 14, 2018 (JP) .............................. JP2018-024270

(51) Int. Cl.
*H01S 5/028* (2006.01)
*H01S 5/22* (2006.01)
(Continued)

(52) U.S. Cl.
CPC .......... *H01S 5/0282* (2013.01); *H01S 5/0087* (2021.01); *H01S 5/028* (2013.01);
(Continued)

(58) Field of Classification Search
CPC .. H01S 5/34333; H01S 5/0282; H01S 5/0283; H01S 5/0285; H01S 5/0287
See application file for complete search history.

(56) References Cited

U.S. PATENT DOCUMENTS 6,618,409 B1 9/2003 Hu et al.
9,202,988 B2 * 12/2015 Yoshida ................ H01S 5/0282
(Continued)

FOREIGN PATENT DOCUMENTS

JP 2010-287717 A 12/2010
JP 5184927 B2 4/2013
(Continued)

OTHER PUBLICATIONS

International Search Report and Written Opinion dated Feb. 5, 2019 in International Application No. PCT/JP2018/041524, with partial English translation.

*Primary Examiner* — Tod T Van Roy
(74) *Attorney, Agent, or Firm* — McDermott Will & Emery LLP

(57) ABSTRACT

Provided is a nitride semiconductor laser element which includes: a stacked structure including a plurality of semiconductor layers including a light emitting layer, the stacked structure including a pair of resonator end faces located on opposite ends; and a protective film including a dielectric body and disposed on at least one of the pair of resonator end faces. The protective film includes a first protective film (a first emission surface protective film), a second protective film (a second emission surface protective film), and a third protective film (a third emission surface protective film) disposed in stated order above the stacked structure. The first protective film is amorphous, the second protective film is crystalline, and the third protective film is amorphous.

20 Claims, 12 Drawing Sheets

(51) Int. Cl.
*H01S 5/343* (2006.01)
*H01S 5/00* (2006.01)
*H01S 5/02* (2006.01)
*H01S 5/02212* (2021.01)

(52) U.S. Cl.
CPC .......... *H01S 5/0285* (2013.01); *H01S 5/0287* (2013.01); *H01S 5/2216* (2013.01); *H01S 5/34333* (2013.01); *H01S 5/0071* (2013.01); *H01S 5/0202* (2013.01); *H01S 5/02212* (2013.01)

(56) References Cited

U.S. PATENT DOCUMENTS

| | | | | |
|---|---|---|---|---|
| 9,214,585 | B2* | 12/2015 | Rana | .................... H01L 31/0682 |
| 10,714,900 | B2* | 7/2020 | Jakubowicz | .......... H01S 5/0283 |
| 2002/0146857 | A1* | 10/2002 | Ichihara | .................... H01S 5/16 |
| | | | | 438/47 |
| 2008/0205464 | A1 | 8/2008 | Michiue et al. | |
| 2009/0236630 | A1* | 9/2009 | Mochida | ................ H01S 5/0281 |
| | | | | 438/46 |
| 2010/0316082 | A1* | 12/2010 | Kawaguchi | ......... H01S 5/34333 |
| | | | | 372/49.01 |
| 2012/0057612 | A1* | 3/2012 | Yoshida | ............... H01S 5/32341 |
| | | | | 372/49.01 |
| 2013/0022070 | A1* | 1/2013 | Tange | .................... H01S 5/0282 |
| | | | | 438/22 |
| 2014/0346557 | A1* | 11/2014 | Yoshida | .................. H01L 33/44 |
| | | | | 257/103 |
| 2015/0124847 | A1* | 5/2015 | Yoshida | ................. B82Y 20/00 |
| | | | | 372/49.01 |
| 2020/0373730 | A1* | 11/2020 | Kitagawa | ............... H01S 5/0087 |

FOREIGN PATENT DOCUMENTS

| | | |
|---|---|---|
| JP | 5670009 B2 | 2/2015 |
| WO | 2012067047 A1 | 5/2012 |
| WO | 2014002339 A1 | 1/2014 |

\* cited by examiner 10  11   12  13

1010  1111  1112

EMISSION SURFACE SIDE REFLECTANCE

REFLECTIVE SURFACE SIDE REFLECTANCE

NITRIDE SEMICONDUCTOR LASER ELEMENT AND ILLUMINATION LIGHT SOURCE MODULE

CROSS REFERENCE TO RELATED APPLICATIONS

This application is a U.S. continuation application of PCT International Patent Application Number PCT/JP2018/041524 filed on Nov. 8, 2018, claiming the benefit of priority of Japanese Patent Application Number 2018-024270 filed on Feb. 14, 2018, the entire contents of which are hereby incorporated by reference.

BACKGROUND

1. Technical Field

The present disclosure relates to nitride semiconductor laser elements, and in particular to a nitride semiconductor laser element, etc. including a protective film on a resonator end face.

2. Description of the Related Art

Conventionally, a semiconductor laser element has been widely used mainly for reading from and writing to an optical disc, and an optical output of such a semiconductor laser element, in general, has been approximately greater than or equal to 0.01 W and less than or equal to 0.4 W.

Meanwhile, in recent years, LEDs and semiconductor laser elements, which are semiconductor elements having features such as high luminance, high definition, low power consumption, and long life, have begun to be used as light sources for projectors, instead of high-pressure mercury lamps. In particular, for large-screen, high-image-quality applications such as digital signage and cinema projectors, laser projectors in which a watt-class high-power semiconductor laser element is employed as a light source have begun to spread. Furthermore, the above-described watt-class high-power semiconductor laser element has begun to be applied to a light source for vehicle-mounted headlights and a light source for laser processing, and the laser light source is spreading to various fields.

The semiconductor light emitting element suitable for the above-described light source for the projector is a semiconductor laser (nitride semiconductor laser) element including a nitride-based material. For example, when a nitride semiconductor laser element is used to form a blue-violet light source having a wavelength of 405 nm or a blue light source having a wavelength of 450 nm and a phosphor is excited to emit blue light, green light, and red light, it is possible to implement a laser projector that achieves high luminance with a low power consumption.

However, it is generally known that, in a high optical output operation, a semiconductor laser element involves a deterioration phenomenon in which an operating current gradually increases, and a phenomenon called catastrophic optical damage (COD) in which the semiconductor laser element stops oscillating.

Therefore, in order to achieve a higher-power output of the semiconductor laser element, research and development for suppressing or preventing such deterioration of the semiconductor laser element have been actively conducted.

In particular, since a sudden death associated with COD occurs at an emission-side end face which is a light emission surface of a resonator included in the semiconductor laser element, efforts have been exerted, such as making the protective film covering the end face of the resonator rugged and stable.

In general, the resonator end face of a semiconductor laser element is covered with a protective film, and the protective film plays a role of controlling reflectance at the resonator end face, preventing foreign substances from adhering, and preventing oxidation. Regarding the mechanism of COD, it is considered that COD is caused by light absorption due to the surface states stemming from unshared electrons (dangling bonds) on the light emission surface of the semiconductor laser element, in particular, in the vicinity of the laser emission point, and light absorption resulting from oxidation at the resonator end face due to oxygen diffused in the protective film. Heat is generated due to the light absorption at the resonator end face, and the band gap in proximity to the resonator end face is thermally reduced. As a result, the light absorption at the resonator end face is accelerated, leading to the occurrence of COD. In addition, there are instances where a phenomenon that may cause COD occurs also in the protective film. For example, in some cases, the dielectric film forming the protective film is altered or changed in volume due to strong light or heat, thereby causing film peeling of the protective film, leading to the occurrence of COD. In view of the above, as a protective film on the resonator end face (end face protective film), a rugged film that has a barrier property against oxygen diffusion and is not altered by strong light or heat is required.

Here, a protective film provided on the resonator end face of the conventional semiconductor laser element will be described with reference to FIG. 15. FIG. 15 is a plan view illustrating a structure of the protective film on a resonator end face of conventional nitride semiconductor laser element 1000.

In FIG. 15, on an emission-side end face of stacked structure 1010 including a light emitting layer, first emission surface protective film 1011 and emission surface reflectance adjusting layer 1015 are disposed in stated order from the emission-side end face side. First reflective surface protective film 1021 and reflective surface reflectance adjusting layer 1025 are disposed on a reflective-side end face in stated order from the reflective-side end face.

In conventional nitride semiconductor laser element 1000, a crystalline AlN film is employed for first emission surface protective film 1011 and first reflective surface protective film 1021.

The crystal structure of AlN is a hexagonal wurtzite structure, and its orientation and film durability are disclosed in the following related art documents.

For example, Japanese Patent No. 5670009 discloses a method of forming a crystalline AlN film having an m-axis orientation on an m-plane end face of GaN.

In addition, Japanese Patent No. 5184927 discloses a method of forming a crystalline AlN film having a c-axis orientation on a GaN substrate.

As described in the above-mentioned related art documents, it is considered to be essential to precisely control the crystal orientation of the AlN film in order to improve the durability of the protective film on the resonator end face.

SUMMARY

As described above, crystalline AlN having a high oxygen barrier property and being rugged is employed for the protective film in contact with the resonator end face of the conventional nitride semiconductor laser element.

However, it is known that a subtle amount of oxygen diffusion depending on crystal grain boundaries, crystal orientation, etc. occurs in a crystalline AlN film according to the conventional techniques, and the inventors have found that the following problems occur when an AlN film is applied to a nitride semiconductor laser element having a high-power optical output.

When crystalline AlN having an m-axis orientation is used in the protective film, since the bond length between the atoms constituting the crystal is long and the crystal structure is sparse, the element easily permeates the m-plane and oxygen also easily permeates the m-plane. Accordingly, it is likely to cause deterioration of the resonator end face and an optical damage.

In addition, when a crystalline AlN film having a c-axis orientation is used, the film having the c-axis orientation has a dense structure and has a high barrier property against diffusion of impurities from the outside. However, the film having the c-axis orientation has a crystal grain boundary, and thus diffusion at grain boundaries is unavoidable.

Since the above-described problem of the crystal grain boundary also exists in the film having the m-axis orientation, the above-described problem cannot be solved by merely controlling the crystal orientation, and thus a new technique needs to be developed.

The present disclosure solves such a problem, and provides a nitride semiconductor laser element and the like capable of suppressing the deterioration of the resonator end face even in a high-power optical output operation.

In order to solve the above-described problems, one aspect of a nitride semiconductor laser element according to the present disclosure includes: a stacked structure including a plurality of semiconductor layers including a light emitting layer, the stacked structure including a pair of resonator end faces located on opposite ends; and a protective film including a dielectric body and disposed on at least one of the pair of resonator end faces. In the above-described nitride semiconductor laser element according to the present disclosure, the protective film includes a first protective film, a second protective film, and a third protective film disposed in stated order above the stacked structure, the first protective film is amorphous, the second protective film is crystalline, and the third protective film is amorphous.

According to the above-described structure, oxygen that diffuses through the crystal grain boundaries of the second protective film including, for example, a crystalline nitride film or a crystalline oxynitride film can be blocked by the amorphous first protective film having no grain boundaries. In addition, since the dangling bond on the resonator end face can be efficiently terminated by the amorphous first protective film, it is possible to suppress decomposition of the resonator end face. As a result, it is possible to provide a nitride semiconductor laser element capable of suppressing the deterioration of the resonator end face even in a high-power operation.

In addition, the second protective film may be one of an aluminum nitride film and an aluminum oxynitride film each of which includes a hexagonal polycrystalline film having a c-axis orientation normal to the at least one of the pair of resonator end faces.

In this manner, by using aluminum nitride or aluminum oxynitride as the second protective film, it is possible to implement a protective film having high oxygen barrier properties and excellent thermal conductivity. In addition, by using a polycrystalline film having a c-axis orientation and a dense structure as the second protective film, it is possible to form a crystalline film having a large crystal grain size. Accordingly, it is possible to reduce oxygen diffusion and light absorption at the crystal grain boundary. As a result, the deterioration of the resonator end face can be further suppressed.

Here, the polycrystalline film having the c-axis orientation defined in the present disclosure is not limited to a polycrystalline film formed only by the crystals having the c-axis orientation. The polycrystalline film having the c-axis orientation may be a polycrystalline film in which most of the region includes the crystals having the c-axis orientation corresponding to the normal direction of the resonator end face, and may be a polycrystalline film in which a crystal having a different orientation such as a crystal having an m-axis orientation corresponding to the normal direction of the resonator end face is included in part of the region. For example, the one of the aluminum nitride film and the aluminum oxynitride film included in the second protective film may include a crystal having an orientation different from the c-axis orientation.

In addition, the polycrystalline film having the c-axis orientation defined in the present disclosure may be a polycrystalline film in which most of the region includes the crystals having the c-axis orientation corresponding to the normal direction of the resonator end face, and an amorphous portion is included in part of the region. For example, the one of the aluminum nitride film and the aluminum oxynitride film included in the second protective film may include an amorphous portion.

In addition, a total film thickness of the first protective film and the second protective film may be less than 50 nm.

According to this structure, it is possible to reduce the amount of light absorption resulting from the defects contained in the first protective film and the second protection film, and the amount of light absorption resulting from the crystal grain boundaries, by reducing the film thickness corresponding to the optical path length. In this manner, it is possible to suppress heat generation and deterioration of the resonator end face. As a result, it is possible to further suppress deterioration of the resonator end face.

In addition, a film thickness of the first protective film may be less than 1.0 nm.

According to this structure, it is possible to improve the crystallinity of the second protective film or to increase the density of the second protective film. As a result, it is possible to suppress oxygen diffusion in the second protective film and further suppress deterioration of the resonator end face. Accordingly, the reliability of the nitride semiconductor laser element can be significantly improved.

In addition, the first protective film may be an amorphous film containing one of silicon nitride and silicon oxynitride.

According to this structure, since silicon nitride or silicon oxynitride is unlikely to undergo alteration such as crystallization due to light, and can form a dense amorphous film having a high oxygen barrier property, it is possible to further improve termination of the resonator end face and the oxygen barrier property, and thus the deterioration of the resonator end face can be further suppressed.

In addition, the third protective film may be an amorphous film including metal oxide or metal oxynitride.

As described above, by providing the film including the metal oxide or the metal oxynitride as the second protective film, the surface dangling bond of the crystalline second protective film can be terminated. As a result, it is possible to further suppress the deterioration of the resonator end face.

In addition, the third protective film may be an amorphous film containing one of aluminum oxide and aluminum oxynitride.

According to this structure, by using aluminum oxide or aluminum oxynitride having a large binding energy with oxygen, it is possible to suppress the diffusion of oxygen in the third protective film and the fluctuation of the refractive index due to the oxidation reaction with oxygen contained in the external air. As a result, it is possible to further suppress the deterioration of the resonator end face.

In addition, the first protective film and the second protective film may each have a noble gas atom concentration less than 1 atomic percent, and the third protective film may have a noble gas atom concentration greater than or equal to 1 atomic percent and less than 3 atomic percent.

According to this structure, the density of the first protective film can be increased by reducing, to equal to or less than 1%, the concentration of noble gas atom such as Ar in the first protective film as an end face terminating layer. As a result, it is possible to implement efficiently terminating the end face and suppressing oxygen diffusion. In addition, the defect density generated inside the crystal can be suppressed by reducing, to equal to or less than 1%, the concentration of noble gas atom such as Ar in the second protective film as an oxygen diffusion suppressing layer. As a result, it is possible to implement the suppression of light absorption and the improvement of the oxygen barrier property. In addition, by increasing, to equal to or greater than 1%, the concentration of noble gas atom such as Ar in the third protective film as an oxidation protective layer, it is possible to inhibit atom transfer and rearrangement in the film. As a result, it is possible to suppress a change of phase and alteration of the dielectric film. Accordingly, it is possible to provide a semiconductor laser having a high optical output capable of suppressing deterioration of the resonator end face. In addition, by suppressing, to equal to or less than 3%, the concentration of noble gas atom such as Ar in the third protective film, it is possible to suppress a large change in the film thickness and the film density due to cohesion of the noble gas contained in the third protective film, which light and heat cause inside the film, or due to desorption of the noble gas from the film. Therefore, it is possible to suppress the fluctuation of the reflectance and the film peeling on the resonator end face, and to suppress the deterioration of the resonator end face.

In addition, the second protective film may be an oxygen diffusion suppressing layer.

As described above, it is possible to suppress oxygen from reaching the resonator end face, by suppressing the diffusion of oxygen by the crystalline second protective film. As a result, it is possible to further suppress the deterioration of the resonator end face.

In addition, the second protective film may have a noble gas atom concentration less than a noble gas atom concentration of the first protective film.

According to this structure, the defect density generated inside the crystal of the second protective film can be suppressed, and thus it is possible to implement suppression of light absorption and improvement of the oxygen barrier property.

In addition, the first protective film may have a noble gas atom concentration less than a noble gas atom concentration of the third protective film.

According to this structure, the density of the first protective film can be increased, and thus it is possible to implement efficiently terminating the end face and suppressing oxygen diffusion. In addition, since atom transfer and rearrangement in the third protective film can be inhibited, it is possible to suppress the change of phase and alteration of the dielectric film.

In addition, the second protective film may have a noble gas atom concentration less than a noble gas atom concentration of the third protective film.

According to this structure, the defect density generated inside the crystal of the second protective film can be suppressed, and thus it is possible to implement suppression of light absorption and improvement of the oxygen barrier property. In addition, since atom transfer and rearrangement in the third protective film can be inhibited, it is possible to suppress the change of phase and alteration of the dielectric film.

In addition, the protective film may further include a reflectance adjusting layer disposed above the third protective film and including at least one dielectric film.

According to this structure, it is possible to adjust the reflectance at each of the resonator end faces, and to protect the third protective film.

In addition, the protective film may further include a fourth protective film disposed between the third protective film and the reflectance adjusting layer, the fourth protective film containing one of nitride and oxynitride.

In this manner, by adding the fourth protective film including nitride or oxynitride, it is possible to strengthen an oxygen diffusion suppressing function and suppress degassing from the dielectric film located in proximity to the resonator end face. As a result, it is possible to suppress fluctuations in reflectance at the end face and film peeling.

In addition, the fourth protective film may be a hexagonal polycrystalline film containing one of aluminum oxide and aluminum oxynitride, and a crystal orientation of the fourth protective film may be a c-axis orientation corresponding to a normal direction of the at least one of the pair of resonator end faces above which the fourth protective film is disposed.

In this manner, by using as the fourth protective film an aluminum nitride film or an aluminum oxynitride film having a high oxygen barrier property and excellent thermal conductivity, and making the fourth protective film a hexagonal crystal having the c-axis orientation, it is possible to form a crystalline film having a large crystal grain size. For this reason, it is possible to reduce oxygen diffusion and light absorption at the crystal grain boundaries. As a result, it is possible to suppress deterioration of the resonator end face even in a high-power operation.

In addition, the fourth protective film may have a noble gas atom concentration less than 1 atomic percent and a film thickness less than 50 nm.

According to this structure, it is possible to reduce the amount of light absorption resulting from the defects contained in the fourth protective film and the amount of light absorption resulting from the crystal grain boundaries, by reducing the film thickness corresponding to the optical path length. As a result, it is possible to suppress the heat generation of the resonator end face and suppress the deterioration, and thus deterioration of the resonator end face can be suppressed.

In addition, the at least one dielectric film included in the reflectance adjusting layer may include a dielectric film that is in contact with the fourth protective film, and may be an amorphous oxide film having a noble gas atom concentration less than 2 atomic percent.

According to this structure, it is possible to prevent the noble gas from cohering or desorbing from the dielectric film due to heat generation caused by light absorption that occurs in the fourth protective film. As a result, it is possible to suppress the fluctuation of the reflectance and the film peeling on the resonator end face, and to suppress the deterioration of the resonator end face.

In addition, the at least one dielectric film included in the reflectance adjusting layer may have a noble gas atom concentration less than 3 atomic percent.

According to this structure, it is possible to suppress changes in the film thickness and the film density of the dielectric film as a result of the noble gas contained in the dielectric film cohering inside the film or desorbing from the film due to the influence of light or heat. As a result, it is possible to suppress fluctuations in reflectance and film peeling on the resonator end face, and to suppress deterioration of the resonator end face.

In addition, the outermost surface of the protective film may include an oxide.

According to this structure, it is possible to suppress the reflectance fluctuation of the protective film due to the surface reaction with oxygen contained in the external air. As a result, it is possible to further suppress the deterioration of the resonator end face.

In addition, the at least one of the pair of resonator end faces may have a reflectance that is one of a maximum value and a minimum value of a reflectance spectrum with respect to a wavelength of laser emitted by the nitride semiconductor laser element.

According to this structure, it is possible to minimize the fluctuations in reflectance even when a portion of the dielectric film is altered. As a result, it is possible to suppress the property fluctuation of the nitride semiconductor laser element.

In addition, an illumination light source module according to one aspect of the present disclosure includes the above-described nitride semiconductor laser element.

As described above, since the nitride semiconductor laser element capable of suppressing the deterioration of the resonator end face even in a high-power operation is provided, it is possible to implement the illumination light source module having high reliability and durability.

According to the present disclosure, it is possible to provide a nitride semiconductor laser element capable of suppressing the deterioration of the resonator end face even in a high-power operation.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments of the present disclosure will be described with reference to the drawings. It should be noted that each of the embodiments described below shows a specific example of the present disclosure. Therefore, numerical values, shapes, materials, structural components, the arrangement and connection of the structural components, etc. indicated in the following exemplary embodiments are mere examples, and are not intended to limit the scope of the present disclosure. Furthermore, among the structural components in the following embodiments, components not recited in the independent claims which indicate the broadest concepts of the present disclosure are described as arbitrary structural components.

In addition, each of the diagrams is a schematic diagram and thus is not necessarily strictly illustrated. Therefore, the scale sizes and the like are not necessarily exactly represented in each of the diagrams. In each of the diagrams, substantially the same structural components are assigned with the same reference signs, and redundant descriptions will be omitted or simplified.

Moreover, in this Specification, the terms "above" and "below" do not refer to the upward (vertically upward) direction and downward (vertically downward) direction in terms of absolute spatial recognition, and are used as terms defined by relative positional relationships based on the stacking order of a stacked structure. Furthermore, the terms "above" and "below" are applied not only when two structural components are disposed with a gap therebetween or when a separate structural component is interposed between two structural components, but also when two structural components are disposed in close contact with each other or when two structural components come into contact with each other.

Embodiment 1

Figure 1A:
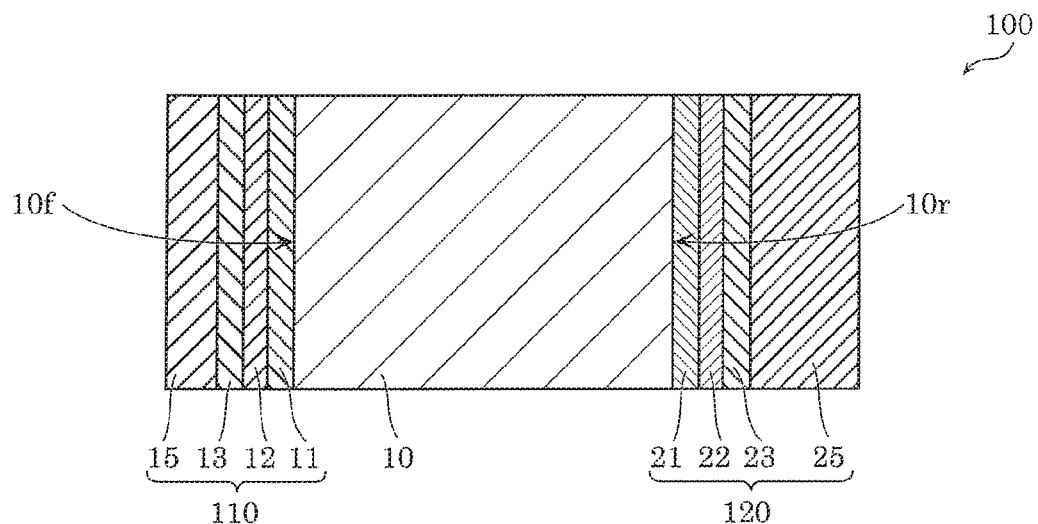
FIG. 1A is a schematic cross-sectional view illustrating a structure of a nitride semiconductor laser element according to Embodiment 1, taken in a direction parallel to a resonator direction.
Figure 1B:
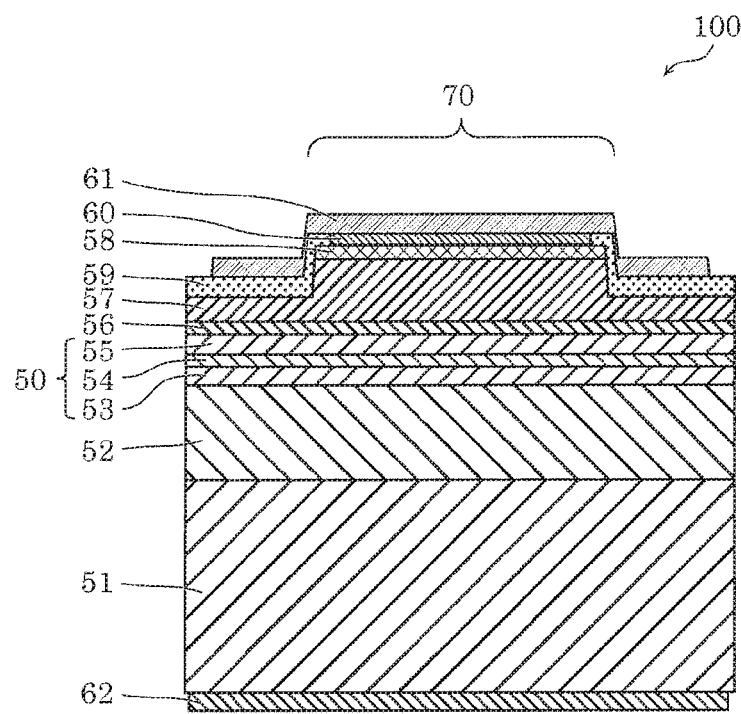
FIG. 1B is a schematic cross-sectional view illustrating a structure of the nitride semiconductor laser element according to Embodiment 1, taken in a direction perpendicular to the resonator direction.

A nitride semiconductor laser element according to Embodiment 1 will be described with reference to FIG. 1A and FIG. 1B. FIG. 1A and FIG. 1B are schematic cross-sectional views illustrating the structure of nitride semiconductor laser element 100 according to the present embodiment, taken in directions parallel to and perpendicular to a resonator direction.

As illustrated in FIG. 1A, nitride semiconductor laser element 100 according to the present embodiment includes stacked structure 10 including a pair of resonator end faces 10$f$ and 10$r$ located on opposite ends, and a protective film that includes a dielectric body and is disposed on at least one of the pair of resonator end faces 10$f$ and 10$r$. According to the present embodiment, nitride semiconductor laser element 100 includes protective films 110 and 120 respectively disposed on the pair of resonator end faces 10$f$ and 10$r$.

As illustrated in FIG. 1A, protective film 110 is a dielectric multilayer film that covers resonator end face 10$f$ which is an end face of stacked structure 10 located on the side from which laser light is emitted (i.e., a front side). Protective film 110 includes first emission surface protective film 11, second emission surface protective film 12, third emission surface protective film 13, and emission surface reflectance adjusting layer 15 which are stacked in stated order from a stacked structure 10 side. Protective film 120 is a dielectric multilayer film that covers resonator end face 10$r$ which is an end face of stacked structure 10 located on the side at which laser light is reflected (i.e., a rear side). Protective film 120 includes first reflective surface protective film 21, second reflective surface protective film 22, third reflective surface protective film 23, and reflective surface reflectance adjusting layer 25 which are disposed in stated order from the stacked structure 10 side.

First, the stacked structure of stacked structure 10 will be described.

As illustrated in FIG. 1B, stacked structure 10 includes a plurality of semiconductor layers including light emitting layer 50. More specifically, stacked structure 10 includes substrate 51, n-type clad layer 52, light emitting layer 50, electron barrier layer 56, p-type clad layer 57, p-type contact layer 58, current blocking layer 59, p-side ohmic electrode 60, p-side electrode 61, and n-side electrode 62.

Substrate 51 is a component that serves as a base of stacked structure 10. According to the present embodiment, substrate 51 is a GaN substrate.

N-type clad layer 52 is an n-type semiconductor layer that is disposed above substrate 51 and covers light emitting layer 50. According to the present embodiment, n-type clad layer 52 includes n-type AlGaN.

Light emitting layer 50 is a layer that is disposed above n-type clad layer 52 and generates light. According to the present embodiment, light emitting layer 50 includes n-type guide layer 53, quantum well active layer 54, and p-side guide layer 55.

N-type guide layer 53 is a layer disposed above n-type clad layer 52, and includes, for example, n-type GaN. Quantum well active layer 54 is an active layer disposed above n-type guide layer 53, and includes, for example, undoped InGaN. P-side guide layer 55 is a layer disposed above quantum well active layer 54, and includes, for example, undoped InGaN.

Electron barrier layer 56 is disposed above p-side guide layer 55, is a layer that suppresses the overflow of electrons from p-side guide layer 55 to p-type clad layer 57, and includes, for example, AlGaN.

P-type clad layer 57 is a layer disposed above electron barrier layer 56, and includes, for example, p-type AlGaN.

P-type contact layer 58 is a layer disposed above p-type clad layer 57, and includes, for example, p-type GaN.

Waveguide 70 having a ridge shape is disposed on part of p-type clad layer 57 and p-type contact layer 58. It should be noted that, although only one waveguide 70 is illustrated in FIG. 1B, stacked structure 10 may include a plurality of waveguides 70.

Current block layer 59 is a dielectric layer disposed in a region, except a portion, on waveguide 70 having the ridge-shape, and includes, for example, SiO$_2$. In other words, current blocking layer 59 covers p-type clad layer 57.

P-side ohmic electrode 60 is an electrode disposed in an opening of current blocking layer 59 and above p-type contact layer 58, and includes, for example, Pd and Pt.

P-side electrode 61 is an electrode disposed above p-side ohmic electrode 60, and includes, for example, Ti, Pt, and Au.

N-side electrode 62 is an electrode disposed below substrate 51 to be opposite to p-side electrode 61, and includes, for example, Ti, Pt, and Au.

Next, the stacked structure of protective films 110 and 120 disposed respectively on resonator end faces 10$f$ and 10$r$ will be described.

The semiconductor laser stacked structure includes resonator end faces 10$f$ and 10$r$ on the emission side and the reflective side, respectively, and protective films 110 and 120 each having a stacked structure in which a plurality of dielectric films are stacked are disposed.

As illustrated in FIG. 1A, on resonator end face 10$f$ located on the emission side, first emission surface protective film 11, second emission surface protective film 12, third emission surface protective film 13, and emission surface reflectance adjusting layer 15 are disposed in stated order from the stacked structure 10 side. In addition, on resonator end face 10$r$ located on the reflective side, first reflective surface protective film 21, second reflective surface protective film 22, third reflective surface protective film 23, and reflective surface reflectance adjusting layer 25 are disposed in stated order from the stacked structure 10 side.

Next, a method of manufacturing nitride semiconductor laser element 100 illustrated in FIG. 1A and FIG. 1B will be described.

First, semiconductor layers including a plurality of nitride semiconductors are epitaxially grown on a c-plane of substrate 51 including n-type GaN.

More specifically, n-type clad layer 52 including n-type AlGaN doped with Ge and n-type guide layer 53 including n-type GaN are sequentially grown, and then quantum well active layer 54 including InGaN is formed. Quantum well active layer 54 includes a well layer including InGaN and a barrier layer including InGaN.

Next, p-side guide layer 55 including undoped InGaN and p-type electron barrier layer 56 are sequentially grown on quantum well active layer 54. Then, p-type clad layer 57 including p-type AlGaN doped with Mg and p-type contact layer 58 including p-type GaN are formed.

Then, waveguide 70 having a ridge shape is formed. More specifically, using a resist film and a $SiO_2$ film as masks, an elongated opening having a width of approximately 7 μm is formed by using a photolithography technique, and then by using an etching technique, ridge-shaped waveguide 70 is formed by etching a region having a predetermined depth from the upper surface of p-type contact layer 58 and p-type clad layer 57. Waveguide 70 has functions as a current injection region and an optical waveguide.

Next, current blocking layer 59 including a $SiO_2$ film having a thickness of approximately 300 nm is formed by using a plasma chemical vapor deposition (CVD) method.

Then, p-side ohmic electrode 60 is formed. More specifically, current blocking layer 59 on ridge-shaped waveguide 70 is etched by using the etching technique using a resist film as a mask to form an elongated opening. Next, p-side ohmic electrode 60 is formed by sequentially stacking a Pt film and a Pd film on ridge-shaped waveguide 70, by using a vacuum evaporation method and the etching technique.

Then, p-side electrode 61 is formed. More specifically, after forming a non-injection region, a Ti film and an Au film are sequentially stacked in a predetermined region on p-side ohmic electrode 60 and current block layer 59 by using the vacuum evaporation method and a lift-off method. As a result, p-side electrode 61 is formed.

Then, polishing is performed from the lower surface (main surface on which the semiconductor layers are not stacked) of substrate 51 that is located opposite to p-side electrode 61, until the total thickness from substrate 51 to p-side electrode 61 is reduced to be approximately 85 μm.

Lastly, n-side electrode 62 is formed by stacking a Ti film, a Pt film, and an Au film on the polished surface of substrate 51 in stated order from the substrate 51 side, by using the vacuum evaporation method.

In such a manner as described above, it is possible to manufacture the nitride semiconductor laser stacked substrate which is the base material of a plurality of nitride semiconductor laser elements 100.

Next, a manufacturing method for forming nitride semiconductor laser element 100 from the nitride semiconductor laser stacked substrate will be described.

First, in order to cleave the nitride semiconductor laser stacked substrate along the m-plane and process the substrate into a bar-shaped substrate, a cleavage groove that serves as a starting point of cleavage is formed by a laser scribing method.

Next, the nitride semiconductor laser stacked substrate in which the cleavage groove is formed is cleaved to form a bar-shaped substrate having an m-plane end face.

Subsequently, dielectric multilayer films corresponding to protective films 110 and 120 are formed on a cleaved surface of the bar-shaped substrate obtained by cleaving. A first protective film, a second protective film, a third protective film, and a reflectance adjusting layer which correspond respectively to first emission surface protective film 11, second emission surface protective film 12, third emission surface protective film 13, and emission surface reflectance adjusting layer 15, are formed in stated order on the emission-side end face obtained by cleavage. On the reflective-side end face that is located on the opposite end to the emission-side end face, a first protective film, a second protective film, a third protective film, and a reflectance adjusting layer which correspond respectively to first reflective surface protective film 21, second reflective surface protective film 22, third reflective surface protective film 23, and reflective surface reflectance adjusting layer 25 are formed in stated order, in the same manner as the emission-side end face. The details of the method of forming protective films 110 and 120 will be described later.

Then, in order to divide the bar-shaped substrate on which the protective films are formed, a dividing groove is formed using the laser scribing method.

Lastly, the bar-shaped substrate having the dividing groove is divided into individual pieces. As a result, nitride semiconductor laser element 100 is formed.

The manufacturing method for forming nitride semiconductor laser element 100 has been described so far. The following describes in detail a method of forming protective films 110 and 120 that have high durability and are characteristic components of nitride semiconductor laser element 100.

As a method of forming protective films 110 and 120 according to the present embodiment, a film forming method in which an electron cyclotron resonance (ECR) sputtering method is used will be described below. Although the method in which the ECR sputtering method is used will be described here, the same or similar advantageous effect can be obtained by using other sputtering methods such as the RF sputtering method and the magnetron sputtering method.

In an ECR sputtering apparatus employed in the present embodiment, a noble gas such as Ar is mainly used as a gas for sputtering, and method of, as it is called, a reactive sputtering is used in which $O_2$ is added as a reactive gas when forming an oxide film, and $N_2$ is added as a reactive gas when forming a nitride film.

With the reactive sputtering method, for example, when forming an oxide film, Ar gas and $O_2$ gas are introduced into a film formation chamber that is evacuated to a high vacuum, a magnetic field and microwave power are applied to generate ECR plasma, and further a high-frequency electromagnetic field is applied to a target such as Al, Si, or the like, to sputter a target material by Ar ions. Then the target material that has been sputtered is oxidized in the gas phase or on the surface of the substrate that is subject to the film formation, thereby implementing the formation of an oxide film.

When forming a nitride film, $N_2$ gas is introduced instead of $O_2$ gas.

In addition, when forming the oxynitride film, a mixed gas of $O_2$ gas and $N_2$ gas, or a gas containing nitrogen and oxygen such as NO gas or $N_2O$ gas is introduced at the same time.

In addition, for example, a silicon target is used when forming a silicon oxide film, a silicon nitride film, or a silicon oxynitride film, and an aluminum target is used when forming an aluminum oxide film, an aluminum nitride film, or an aluminum oxynitride film.

Here, the role of each additive gas is summarized as follows.

The role of the noble gas such as Ar is to become Ar ions and collide with the target to sputter the atoms of the target. In addition, the role of the reactive gas is to react with the atoms that have been sputtered to form an oxide or a nitride.

Although Ar, which is the sputtering gas, is inert and thus is originally supposed not to contribute to the film formation, it is known that, when the composition of the film that has been actually formed is analyzed, Ar is contained in the film by several atomic percent (hereinafter also referred to as at %).

The stacked structure of protective films 110 and 120 according to the present embodiment and the role thereof will be described in detail below.

According to the present embodiment, protective film 110 includes first emission surface protective film 11, second emission surface protective film 12, and third emission surface protective film 13 which are disposed in stated order from the resonator end face 10f side, and protective film 120 includes first reflective surface protective film 21, second reflective surface protective film 22 and third reflective surface protective film 23 which are disposed in stated order from the resonator end face 10r side.

First emission surface protective film 11 and first reflective surface protective film 21 are amorphous first protective films, and are amorphous nitride or oxynitride dielectric films according to the present embodiment.

Second emission surface protective film 12 and second reflective surface protective film 22 are crystalline second protective films, and are dielectric films that include c-axis oriented crystalline nitride or c-axis oriented crystalline oxynitride according to the present embodiment.

Third emission surface protective film 13 and third reflective surface protective film 23 are amorphous third protective films, and are amorphous metal oxide or amorphous metal oxynitride dielectric films according to the present embodiment.

Emission surface reflectance adjusting layer 15 and reflective surface reflectance adjusting layer 25 are disposed above third emission surface protective film 13 and third reflective surface protective film 23, respectively, and are reflectance adjusting layers each including at least one dielectric film. With the above-described layers, the reflectance at each of the resonator end faces can be adjusted, and thus it is possible to protect third emission surface protective film 13 and third reflective surface protective film 23.

The roles of the first protective film include a termination function for resonator end faces 10f and 10r and a barrier function against oxygen diffused through the crystal grain boundaries. In other words, the first protective film plays a role of suppressing decomposition of GaN on resonator end faces 10f and 10r by efficiently terminating, using chemical binding, the dangling bond in the GaN region on the end face of stacked structure 10, and a role of finally blocking oxygen that has diffused through the crystal grain boundaries of the second protective film and reached the vicinity of resonator end faces 10f and 10r, by employing an amorphous nitride film in which no crystal grain boundary is present. As the first protective film, an amorphous film containing silicon nitride or silicon oxynitride such as SiN or SiON can be used. By using SiN or SiON as the material of the first protective film, it is possible to form an amorphous film having a high oxygen barrier property and a high density and being free from alteration such as crystallization, on the GaN end face.

The material of the first protective film is not limited to the above-described materials, and for example, other materials can be applied as long as they are amorphous.

The second protective film has a role of an oxygen diffusion suppressing function. In other words, the second protective film is an oxygen diffusion suppressing layer. The second protective film is a crystalline nitride film or a crystalline oxynitride film, and thus it is possible to suppress the oxygen diffusion in a bulk region. As the material of the second protective film, it is possible to use a polycrystalline film containing aluminum nitride or aluminum oxynitride such as AlN or AlON. In particular, AlN has a high oxygen barrier property and an excellent thermal conductivity. It is thus possible to form a protective film having a high heat dissipation property and a high oxygen barrier property, by using AlN for the second protective film. When AlN is used as a material of the second protective film, the crystal structure is a hexagonal wurtzite structure, and it has been known that, as the crystal orientation, two orientation states may be taken, namely an m-axis orientation, as it is called, in which the m-axis is oriented in the normal direction of resonator end faces 10f and 10r, and a c-axis orientation, as it is called, in which the c-axis is oriented in the normal direction of resonator end faces 10f and 10r.

In the case of the m-axis orientation, the bond length between the atoms included in the crystal is long and the crystal structure is sparse, and thus an impurity element such as oxygen easily permeates. It is thus likely to cause deterioration and optical damage of resonator end faces 10f and 10r.

On the other hand, the c-axis orientation has a dense structure and has a high barrier property against the diffusion of impurities from the outside. It is thus considered that the effect of suppressing oxygen diffusion of the c-axis orientation is higher than the effect of suppressing oxygen diffusion of the m-axis orientation. In addition, with the AlN film having the c-axis orientation, it is possible to form a crystalline film having a large crystal grain size, and thus, in this respect as well, the AlN film having the c-axis orientation is more advantageous than the film having the m-axis orientation.

However, even when forming an m-axis orientated film or a c-axis orientated film by controlling the orientation, the resulting film is a polycrystalline film. A grain boundary is inevitably present in polycrystal, and impurities such as oxygen diffuse through the grain boundary at a faster speed than in the bulk region.

For that reason, when the oxygen diffusion suppressing layer is a crystalline film in a single layer, although nitride semiconductor laser element 100 mostly exhibits sufficient reliability, a failure that a deterioration speed significantly increases occurs in an element in which the crystal grain boundary happens to be present at the laser emission point.

Protective films 110 and 120 of resonator end faces 10f and 10r according to the present embodiment have a structure in which first protective films which are amorphous films and have no crystal grain boundary are inserted respectively between the second protective films and resonator end faces 10f and 10r, in order to prevent oxygen diffused through the crystal grain boundaries of the second protective films from reaching the resonator end faces.

Here, the orientation of the first protective film and the second protective film according to the present embodiment will be described with reference to FIG. 2A and FIG. 2B.

Figure 2A:
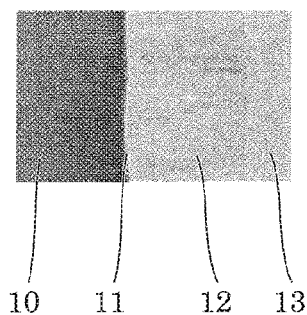
FIG. 2A is a cross-sectional transmission electron microscope (TEM) photograph of the first protective film and the second protective film according to Embodiment 1.

FIG. 2A is a cross-sectional transmission electron microscope (TEM) photograph of the first protective film and the second protective film according to the present embodiment. FIG. 2B is a cross-sectional TEM photograph of the protective film of the first comparative example. FIG. 2A illustrates, as an example of the first protective film and the second protective film, one example of the cross-sectional surface of each of first emission surface protective film 11, second emission surface protective film 12, and third emission surface protective film 13 formed above stacked structure 10. FIG. 2B illustrates, as the first comparative example, a cross-sectional surface of an element in which AlN film 1111 and $Al_2O_3$ film 1112 that have an m-axis orientation are disposed above the resonator end face of stacked structure 1010 in stated order from the stacked structure 1010 side.

Figure 2B:
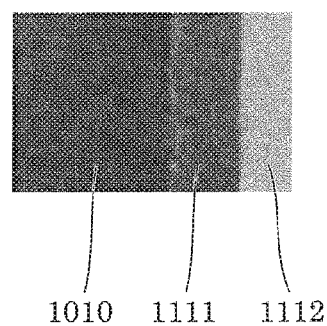
FIG. 2B is a cross-sectional TEM photograph of a protective film according to the first comparative example.

In the element illustrated in FIG. 2B, it has been confirmed from an electron beam diffraction image (not illustrated) that the orientation of AlN film 1111 is the m-axis orientation which is the same orientation as the resonator end face. When AlN film 1111 is formed, it is more stable in terms of energy when the c-axis is oriented in the direction perpendicular to the film formation surface. However, as illustrated in FIG. 2B, when AlN film 1111 is formed on the m-plane of GaN, the AlN film is also likely to be oriented in the m-axis due to the influence of the underlying substrate, and thus it is difficult to form the film having the c-axis orientation.

As illustrated in FIG. 2A, first emission surface protective film 11 including an amorphous SiN film as the first protective film, second emission surface protective film 12 including the crystalline AlN film having the c-axis orientation as the second protective film, and third emission surface protective film 13 including an amorphous $Al_2O_3$ film as a third protective film are disposed in stated order above stacked structure 10.

In the element illustrated in FIG. 2A, it is confirmed, from the cross-sectional TEM photograph of second emission surface protective film 12 and the electron beam diffraction image which is not illustrated, that the AlN film as the second protective film is a film in which the c-axis orientated polycrystalline AlN and amorphous AlN are mixedly included. In addition, it was observed that the second protective film includes a polycrystal indicating a c-axis orientation, as a result of lattice planes arranged at intervals corresponding to approximately 0.25 nm, which is half the lattice constant of the c-axis of the AlN crystal, having been observed almost in the entire cross-sectional TEM photograph of second emission surface protective film 12. According to the present embodiment, an amorphous film is formed as the first protective film on resonator end face 10f, and then a crystalline AlN film is formed as the second protective film above the first protective film. As a result, a film having a c-axis orientation that is energetically stable can be easily obtained without being affected by the underlying crystal, and a protective film having a high oxygen diffusion suppressing effect can be stably formed.

The material of the second protective film is not limited to the above-described materials, and for example, other materials can be applied as long as they are crystalline. The second protective film only need to be an aluminum nitride film or an aluminum oxynitride film including a hexagonal polycrystalline film having a c-axis orientation corresponding to the normal direction of the resonator end face above which the second protective film is disposed, out of the pair of resonator end faces 10f and 10r.

It should be noted here that, the polycrystalline film having the c-axis orientation is not limited to a polycrystalline film that includes only the crystals having the c-axis orientation. The polycrystalline film having the c-axis orientation may be a polycrystalline film in which most of the region includes crystals having the c-axis orientation corresponding to the normal direction of the resonator end face, and may be a polycrystalline film in which a crystal having a different orientation such as a crystal having the m-axis orientation corresponding to the normal direction of the resonator end face is included in part of the region. For example, the aluminum nitride film or the aluminum oxynitride film included in the second protective film may include crystals that are included in the aluminum nitride film or the aluminum oxynitride film and have an orientation different from the c-axis orientation. The crystals that have an orientation different from the c-axis orientation are the aluminum nitride film or the aluminum oxynitride film.

In addition, the polycrystalline film having the c-axis orientation may be a polycrystalline film in which most of the region includes crystals having the c-axis orientation corresponding to the normal direction of the resonator end face, and an amorphous portion is included in part of the region. For example, the aluminum nitride film or the aluminum oxynitride film included in the second protective film may include an amorphous portion included in the aluminum nitride film or the aluminum oxynitride film. The amorphous portion is the aluminum nitride film or the aluminum oxynitride film.

The third protective film has a role of protecting the second protective film from oxidation.

The third protective film terminates the dangling bond on the surface of the second protective film with oxygen, and suppresses the characteristic fluctuation resulting from the refractive index fluctuation due to the oxidation reaction. As the third protective film, an amorphous film containing a metal oxide or a metal oxynitride can be applied. More specifically, an amorphous film containing an aluminum oxide or an aluminum oxynitride such as $Al_2O_3$ or AlON can be used. In particular, by using the aluminum oxide having a large binding energy with oxygen, it is possible to obtain a stable protective film structure without causing a change in refractive index resulting from an oxidation reaction with oxygen contained in the external air.

The material of the third protective film is not limited to the above-described materials, and for example, other materials can be applied as long as they are amorphous.

According to protective films 110 and 120 having the above-described structures, it is possible to block the diffusion of oxygen to each of the resonator end faces and to efficiently terminate the dangling bond on each of the resonator end faces, and thus it is possible to suppress deterioration of the resonator end faces even in a high-power operation in which optical output is greater than or equal to 1 W.

As the film thickness of the first protective film, a film thickness is selected within a range in which the barrier effect against oxygen diffused through the grain boundaries is exerted and the film absorption is not increased. For example, the extinction coefficient of the SiN film employed in the present embodiment is approximately $3 \times 10^{-3}$, which is higher than that of an oxide such as $Al_2O_3$. Accordingly, when the film thickness is increased, heat is generated due to light absorption, leading to deterioration of nitride semiconductor laser element 100. For example, by setting the film thickness to less than 50 nm, it is possible to suppress the deterioration of nitride semiconductor laser element 100.

As the film thickness of the second protective film, a film thickness is selected within a range in which the barrier effect against the oxygen diffusion in a bulk region is exerted, the film absorption is not increased, and film peeling does not occur. The extinction coefficient of the AlN film is approximately $3 \times 10^{-3}$, which is substantially the same as that of the SiN film and is higher than that of an oxide such as $Al_2O_3$. Accordingly, when the film thickness is increased, heat is generated due to light absorption, leading to deterioration of nitride semiconductor laser element 100. For example, by setting the film thickness to less than 50 nm, it is possible to suppress the deterioration of nitride semiconductor laser element 100.

In addition, the AlN film employed in the present embodiment has a large film stress, and if the film thickness is increased, the risk of film peeling increases. For example, by setting the film thickness to less than 50 nm, it is possible to reduce the risk of film peeling.

In addition, since the extinction coefficient of the first protective film and the extinction coefficient of the second protective film are substantially equal to each other, the total thickness of the first protective film and the second protection film may be set to be less than 50 nm, instead of setting the upper limit of the film thickness of each individual film to 50 nm.

The $Al_2O_3$ film used as the third protective film has an extinction coefficient of approximately $5 \times 10^{-4}$, which is one order of magnitude lower than the extinction coefficients of the AlN film and the SiN film. Accordingly, it is not necessary to set restrictions on the film thickness from the viewpoint of heat generation resulting from light absorption. In addition, since the $Al_2O_3$ film has a small stress, it is not necessary to set restrictions on the film thickness from this viewpoint as well.

As described above, the thickness of the third protective film can be arbitrarily selected for the purpose of adjusting the reflectance and the like. When employing an AlON film as the third protective film, attention is required because the extinction coefficient and the film stress tend to be higher than the extinction coefficient and the film stress of the $Al_2O_3$ film. In view of this, the film thickness may be set taking into account the extinction coefficient and the film stress of the film to be used.

Next, the Ar atom concentration of the amorphous film used as the first protective film of the above-described protective film will be described below. As described in the related art document (Japanese Unexamined Patent Application Publication No. 2010-287717), according to the conventional technique, it is considered that the amount of Ar taken into the crystalline film is small, whereas the amount of Ar taken into the amorphous film is large because the density is low and a large number of voids are present in the amorphous film. Ar taken into the amorphous film is considered to affect the deterioration of the resonator end faces by the following mechanism.

First, a void and a defect are generated in the protective film as a result of Ar with a large atomic radius having been taken into the protective film formed on the resonator end face. When a void is generated, the void serves as a path for oxygen diffusion, and oxygen diffused from the outside reaches the interface between the resonator end face and the protective film via the path. This causes a failure that the resonator end face is oxidized and the absorption of light at the resonator end face increases, and thereby the temperature of the resonator end face rises rapidly and the deterioration progresses at an accelerating rate, leading to a breaking of the resonator end face.

In addition, when defects are generated in the protective film, the light absorption of the protective film itself increases. Accordingly, the light absorption increases as in the case of the voids, and this causes a failure that the temperature of the resonator end face rises rapidly and the deterioration progresses at an accelerating rate, leading to a breaking of the resonator end face.

Furthermore, since the chemically unbonded Ar is present in the protective film, Ar atoms move and cohere under a laser operating environment of high optical density and high temperature. This causes, as a result, a failure that the protective film swells and deforms.

As described above, when the conventionally used amorphous film is employed for the end face protective film, the resonator end face is deteriorated more rapidly than when the crystalline film is employed, and it is not applicable for practical use.

However, the inventors of the present application have found, after earnest investigation, that there is a condition for forming a film which is amorphous but has a high density and a low Ar atom concentration. Then, a stacked structure of the protective film according to the present embodiment was formed using the amorphous film of low Ar atom concentration formed under the above-described condition, and the durability of the high-power nitride semiconductor laser element was checked. As a result, it was found that the durability was clearly improved. Hereinafter, the experimental results of the durability of nitride semiconductor laser element 100 according to the present embodiment will be described with reference to FIG. 3A and FIG. 3B.

Figure 3A:
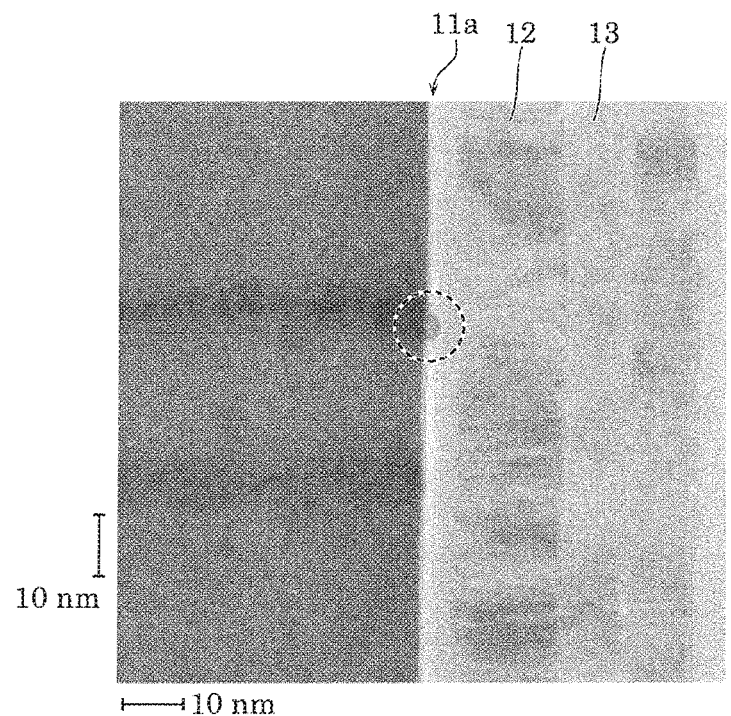
FIG. 3A is a cross-sectional TEM photograph illustrating the vicinity of an interface between a stacked structure and a protective film after continuously driving a nitride semiconductor laser element having a high Ar atom concentration in the first protective film.
Figure 3B:
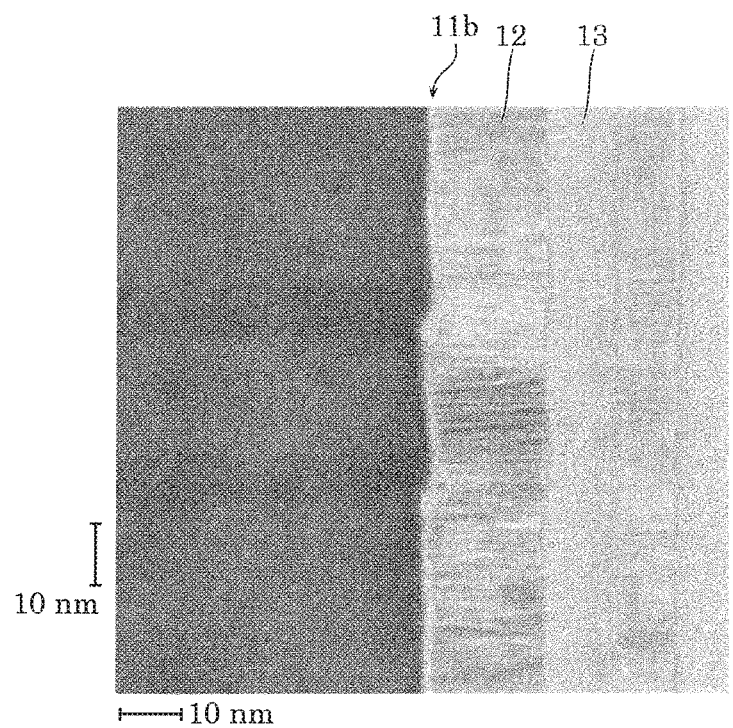
FIG. 3B is a cross-sectional TEM photograph illustrating the vicinity of an interface between a stacked structure and a protective film after continuously driving a nitride semiconductor laser element having a low Ar atom concentration in the first protective film.

FIG. 3A and FIG. 3B are cross-sectional TEM photographs illustrating the vicinity of an interface between a stacked structure and a protective film after continuously driving nitride semiconductor laser elements having Ar densities different from each other in the first protective film. FIG. 3A and FIG. 3B each show a cross-sectional TEM photograph illustrating the vicinity of the interface between the stacked structure and the protective film and of the quantum well active layer, after the nitride semiconductor laser element was continuously driven at a temperature of 25 degrees Celsius for 1000 hours with continuous oscillation and an output of 1.4 W.

This experiment was performed using a SiN film as the amorphous first protective film and an AlN film having the c-axis orientation as the crystalline second protective film. It should be noted that the cross-sectional TEM photographs of the second protective film in FIG. 3A and FIG. 3B are similar to the cross-sectional TEM photograph of second emission surface protective film 12 illustrated in FIG. 2A, and thus the second protective film in FIG. 3A and FIG. 3B has a film quality similar to the film quality of second emission surface protective film 12 illustrated in FIG. 2A.

In the protective film illustrated in FIG. 3A, amorphous SiN film 11*a* having a high Ar atom concentration is used as the first protective film, and in the protective film of the present embodiment illustrated in FIG. 3B, amorphous SiN film 11*b* having a low Ar atom concentration is used as the first protective film.

More specifically, the Ar atom concentration of the SiN film illustrated in FIG. 3A was 3.5 at %, and the Ar atom concentration of the SiN film illustrated in FIG. 3B was 0.5 at %. The Ar atom concentration in the protective film was measured using the Rutherford backscattering (RBS) method.

As illustrated in FIG. 3A, in amorphous SiN film 11*a* displayed in a relatively whitish contrast (gradation) in the center portion of FIG. 3A, there is a round and blackish portion that indicates a deteriorated portion (see the inside of the broken line circle in FIG. 3A), and the deterioration of the resonator end face is clearly observed in the protective film with a high Ar atom concentration. On the other hand, in amorphous SiN film 11b with a low Ar atom concentration illustrated in FIG. 3B, no deterioration is observed, and thus it can be seen that the end face protective film has higher durability.

As described above, it has been found that it is possible to implement a protective film with higher durability, by employing a structure of the protective film which includes a low Ar atom concentration amorphous film as the first protective film and the c-axis oriented crystalline film as the second protective film.

Next, a method for forming a film that is amorphous but has a high density and a low Ar atom concentration will be described with reference to FIG. 4 and FIG. 5.

Figure 4:
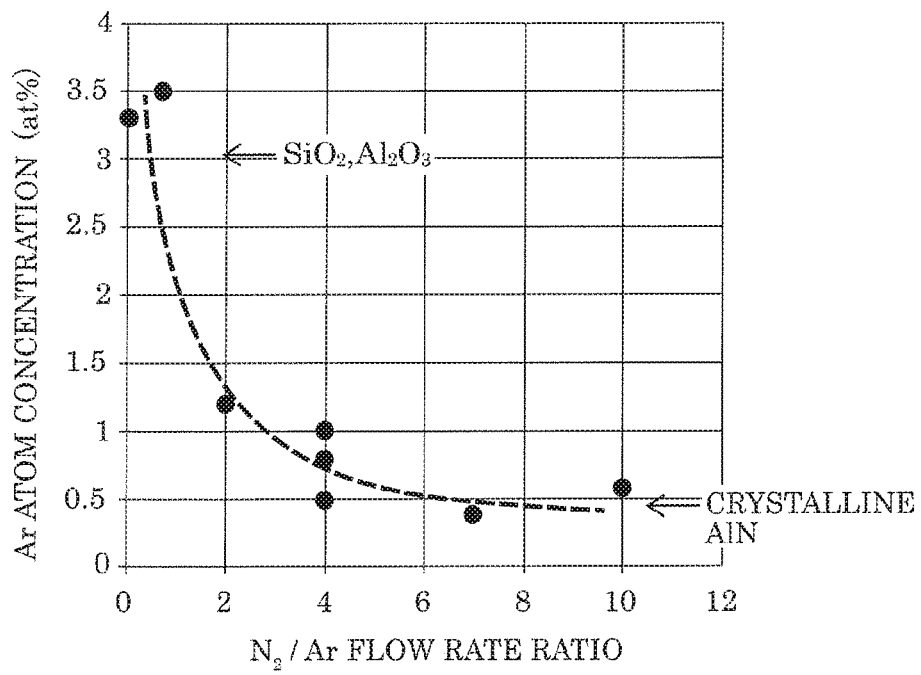
FIG. 4 is a graph showing the relationship between the $N_2$/Ar flow rate ratio and the Ar atom concentration in a film when forming a SiN film using a Si target.

FIG. 4 is a graph showing the relationship between the $N_2$/Ar flow rate ratio and the Ar atom concentration in a film when the SiN film is formed using the Si target. The $N_2$/Ar flow rate ratio on the horizontal axis of FIG. 4 is the ratio of the $N_2$ flow rate and the Ar flow rate during film formation. In addition, the Ar atom concentration in the film on the vertical axis of FIG. 4 is a value measured by the RBS method, and the unit is at %.

As is clear from FIG. 4, the Ar atom concentration in the film is reduced when the $N_2$/Ar flow rate ratio is increased, and under the condition where the flow rate ratio exceeds 6, a film having the Ar atom concentration of 0.5 at % which is substantially equal to the Ar atom concentration of the crystalline AlN film was obtained.

Figure 5:
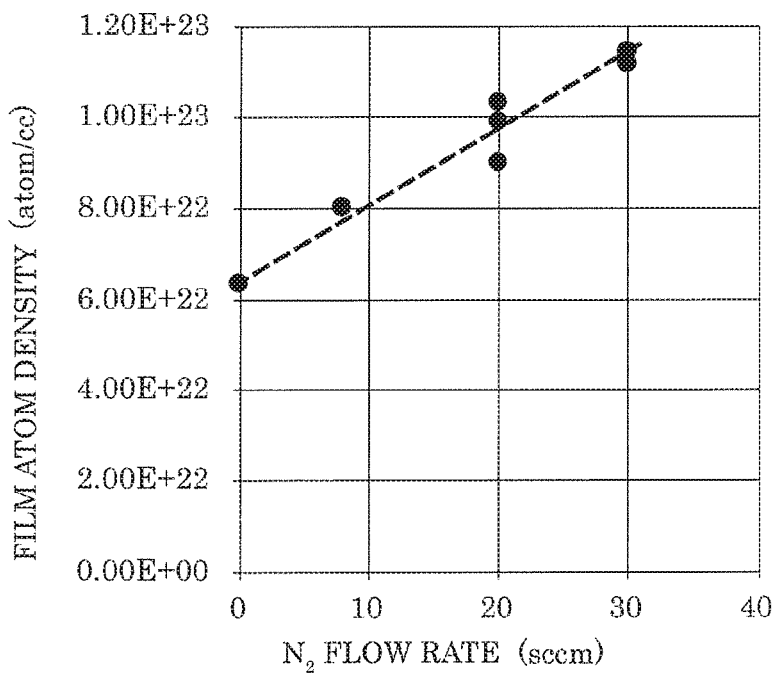
FIG. 5 is a graph showing the relationship between the $N_2$ flow rate during film formation and the film atom density when a SiN film is formed using a Si target.

FIG. 5 is a graph showing the relationship between the $N_2$ flow rate during film formation and the film atom density when a SiN film is formed using a Si target. The film atom density on the vertical axis of FIG. 5 is a value measured by the RBS method, and the unit is atom/cc.

As is clear from FIG. 5, it has been found that the film atom density increases as the $N_2$ flow rate increases during film formation.

From the above results, it is possible to form the amorphous film which is suitable for the first protective film in the protective film according to the present embodiment, and has both a low Ar atom concentration and a high density, by forming the film under the condition that the $N_2$/Ar flow rate ratio is large.

Next, the range of Ar atom concentration of each film of the protective film will be described.

Figure 6:
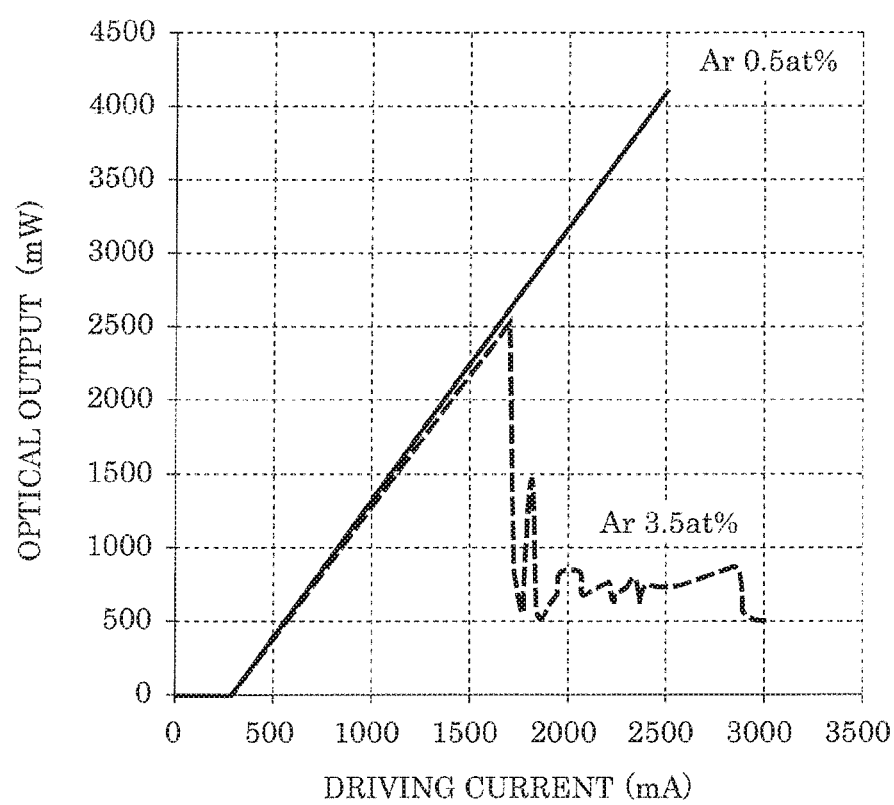
FIG. 6 is a graph showing the characteristics of the optical output with respect to a driving current of the nitride semiconductor laser element according to Embodiment 1.

The first protective film is an amorphous film as described above, and the Ar atom concentration in the film changes between 0.4 at % and 3.5 at % depending on the film forming conditions as shown in FIG. 4. Here, the relationship between the Ar atom concentration of the first protective film and the optical output characteristics of the nitride semiconductor laser element will be described with reference to FIG. 6 and FIG. 7. FIG. 6 is a graph showing the characteristics of the optical output with respect to a driving current of the nitride semiconductor laser element according to the present embodiment. In FIG. 6, a SiN film is employed as the first protective film, and an element having an Ar atom concentration of 0.5 at % and an element having an Ar atom concentration of 3.5 at % in the film are compared.

As is clear from FIG. 6, the element with an Ar atom concentration of 0.5 at % oscillates without any problem up to an optical output of 4 W, but with the element with an Ar atom concentration of 3.5 at %, there was an occurrence of COD, as it is called, in which an output is rapidly decreased at an optical output of 2.5 W.

Figure 7:
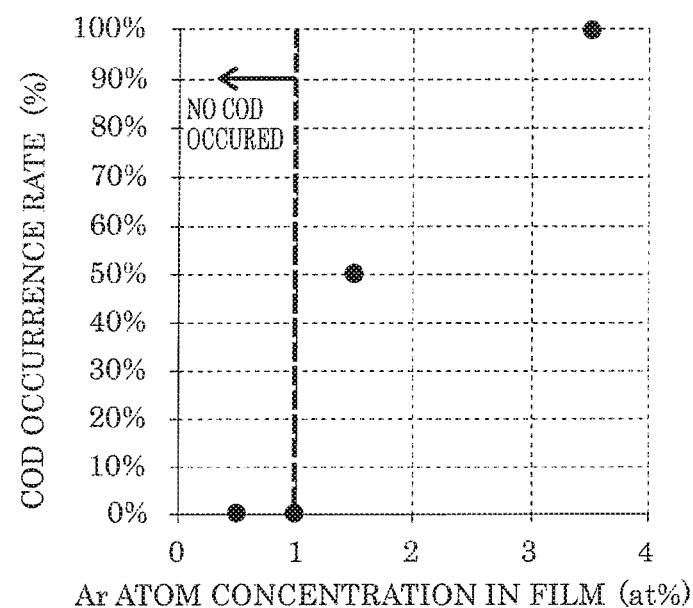
FIG. 7 is a graph showing the relationship between the Ar atom concentration and the COD occurrence rate in the aging test when SiN is employed for the first protective film.

FIG. 7 is a graph showing the relationship between the Ar atom concentration and the COD occurrence rate in the aging test when SiN is employed for the first protective film. The aging conditions are the same as the driving conditions of the elements illustrated in FIG. 3A and FIG. 3B, namely, the continuous oscillation, the output of 1.4 W, and the temperature of 25 degrees Celsius.

As is clear from FIG. 7, as the Ar atom concentration in the first protective film is reduced, the durability of the protective film is improved, and when the Ar atom concentration is less than or equal to 1 at %, a protective film that is free from COD even when continuously driven for 1000 hours was obtained.

As described above, it has been found that both the initial characteristics and the reliability are improved by reducing the Ar atom concentration in the first protective film.

Next, the Ar atom concentration of the second protective film will be described.

The material of the second protective film is crystalline AlN or AlON as described above. When the Ar atom concentration of these crystalline films was measured using the RBS method, a value of around 0.5 at % was obtained, and even in the film formed under different conditions, the Ar atom concentration did not exceed 1 at % when the film was a crystalline film.

In addition, when the oxygen atom concentration of the crystalline AlON film applicable to the second protective film according to the present embodiment was also measured using the RBS method, a value of less than 10% was obtained. To form an AlON film, an Al target is used in an ECR sputtering system, and a film is formed by adding a small amount of $O_2$ gas to Ar gas and $N_2$ gas which are the bases. The oxygen atom concentration in the film is increased and the refractive index is gradually decreased by increasing the amount of $O_2$ gas added. However, it is known that, in a film having an oxygen atom concentration of less than 10% and a refractive index greater than or equal to 1.95, crystallinity is maintained, and it becomes amorphous when the oxygen atom concentration is higher than that. Since the AlON film applicable to the second protective film according to the present embodiment is a crystalline AlON film, the oxygen atom concentration in the film need to be less than or equal to 10%.

Next, the Ar densities of the third protective film and the reflectance adjusting layer will be described.

The third protective film is an oxide or oxynitride of Al as described above. The reflectance adjusting layer is an oxide or oxynitride of Al or Si. The Al or Si oxide film is usually an amorphous film (i.e., an amorphous oxide film), and when the Ar atom concentration is measured by the RBS method, a value of approximately 3.5 at % is obtained.

However, when the Ar atom concentration in the oxide film is too high, the change increases in the film thickness or the film density due to the degassing of Ar in the film at the laser emission point where the temperature becomes high and the optical density becomes large. This causes, as a result, a failure such as the fluctuation of the end face reflectance and the film peeling.

In addition, even when it does not lead to the film peeling, a failure of film expansion in the vicinity of the laser emission point occurs. For that reason, it is also necessary to precisely control the Ar atom concentration of the third protective film.

The Ar atom concentration of the third protective film can be controlled by the Ar flow rate during film formation. For example, the Ar atom concentration in the film is 3.5 at % when the $Al_2O_3$ film is formed under the film forming condition of the Ar flow rate of 30 sccm. However, it is possible to reduce the Ar atom concentration in the film to 1.0 at % by decreasing the Ar flow rate to 10 sccm. Since the film expansion significantly occurs when the Ar atom concentration of the third protective film and the reflectance adjusting layer is greater than or equal to 3 at %, it is possible to suppress the film expansion by setting the Ar atom concentration of the third protective film to less than 3 at %, and it is also possible to suppress the film expansion by setting the Ar atom concentration of the reflectance adjusting layer to less than 3 at %.

On the other hand, in a film containing at least a certain amount of Ar, Ar in the film inhibits the arrangement of atoms, and the advantageous effects that alteration of the film, the change of phase, and amorphous crystallization are suppressed are recognized. For that reason, in the $Al_2O_3$ film having a low Ar atom concentration, the film quality is likely to change due to a photo-crystallization phenomenon, as it is called, in which the amorphous $Al_2O_3$ film gradually changes it's phase into a crystal phase during laser oscillation. Here, the photo-crystallization phenomenon will be described with reference to FIG. 8.

Figure 8:
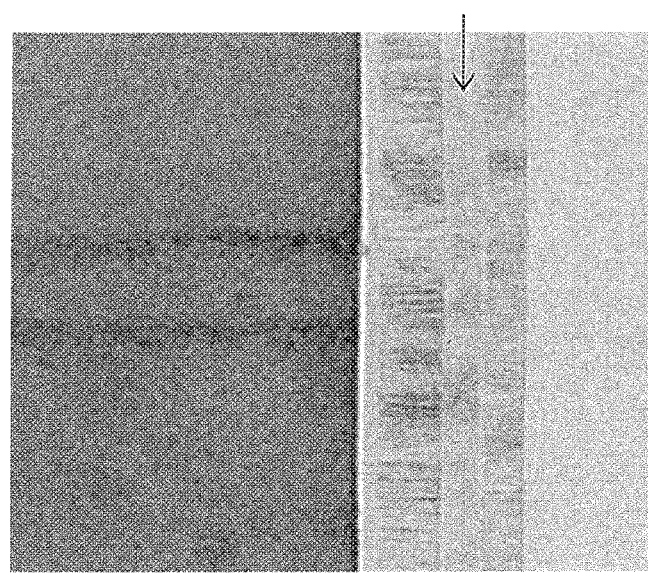
FIG. 8 is a cross-sectional TEM photograph of a photo-crystallized protective film.

FIG. 8 is a cross-sectional TEM photograph of a photo-crystallized protective film. An amorphous SiN film as a first protective film, an AlN film as a second protective film, and an amorphous $Al_2O_3$ film as a third protective film are disposed in stated order above the stacked structure located at the left end of FIG. 8. In the cross-sectional TEM photograph of the second protective film, a cross-sectional TEM photograph similar to the cross-sectional TEM photograph of second emission surface protective film 12 of FIG. 2A was obtained, and thus the second protective film has a film quality similar to the film quality of second emission surface protective film 12 of FIG. 2A.

FIG. 8 is a photograph illustrating a state after the protective film of the stacked structure according to the present embodiment is aged under the overload condition, and the layer indicated by the arrow in the diagram is the third protective film.

Since the third protective film is an amorphous $Al_2O_3$ film and originally has no crystal grains, the third protective film is supposed to have a uniform contrast in the cross-sectional TEM photograph. However, there is a shade contrast in the cross-sectional TEM photograph as indicated in FIG. 8. This suggests that the amorphous film was crystallized. Such a photo-crystallization phenomenon is likely to occur significantly when the Ar atom concentration in the $Al_2O_3$ film is less than 1 at %. For that reason, it is possible to suppress alteration of the film due to the photo-crystallization, by setting the Ar atom concentration in the third protective film to greater than or equal to 1 at %. In other words, according to the present embodiment, there are relationships that the Ar atom concentration of the first protective film is less than the Ar atom concentration of the third protective film, and the Ar atom concentration of the second protective film is less than the Ar atom concentration of the third protective film.

Under the design concept for the protective film as described above, in the present embodiment, the end face protective film was formed under the film forming conditions indicated in the following table.

TABLE 1

|  | First protective film | Second protective film | Third protective film |
| --- | --- | --- | --- |
| Material | Amorphous SiN film | Crystalline AlN film | Amorphous $Al_2O_3$ film |
| Ar flow rate | 5 sccm | 30 sccm | 20 sccm |

TABLE 1-continued

|  | First protective film | Second protective film | Third protective film |
| --- | --- | --- | --- |
| $N_2$ flow rate | 20 sccm | 5 sccm | — |
| $O_2$ flow rate | — | — | 5 sccm |
| Microwave power | 500 W | 500 W | 500 W |
| RF power | 500 W | 500 W | 500 W |
| Film thickness (emission surface) | 2 nm | 20 nm | 13 nm |
| Film thickness (reflective surface) | 2 nm | 8 nm | 125 nm |

The Ar atom concentration in each layer of the protective film formed under the conditions indicated above was 1.0 at % for the first protective film, 0.5 at % for the second protective film, and 2.4 at % for the third protective film.

Subsequently, a reflectance adjusting layer was formed on the third protective film to adjust the reflectance on the emission side and the reflective side.

More specifically, the film type (refractive index), the film thickness, and the number of stacked layers were designed such that the emission surface reflectance adjusting layer 15 has a reflectance of 5.5% at resonator end face 10f at the wavelength of 405 nm which is the oscillation wavelength of nitride semiconductor laser element 100 according to the present embodiment, and that the reflectance at the above-described wavelength has the maximum value of the reflectance spectrum. In addition, the film type, the film thickness, and the number of stacked layers were designed such that reflective surface reflectance adjusting layer 25 has a reflectance of 97% at resonator end face 10r at the wavelength of 405 nm which is the oscillation wavelength, and that the reflectance at the above-described wavelength has the maximum value. According to this structure, it is possible to minimize the fluctuations in reflectance even when a portion of the dielectric film included in the protective film is altered. Accordingly, it is possible to suppress the property fluctuation of nitride semiconductor laser element 100.

Although the present embodiment has disclosed the design example in which the reflectance has the maximum value at the oscillation wavelength, the reflectance may have the minimum value in the vicinity of the oscillation wavelength, or the reflectance on the emission side may have the minimum value and the reflectance on the reflective side may have a maximum value. Within the range of variation of the oscillation wavelength (for example, the range of center wavelength±5 nm), any reflectance design can be employed as long as it satisfies the reflectance range within which the characteristics required for the nitride semiconductor laser element can be implemented (for example, center reflectance±3%).

Figure 9A:
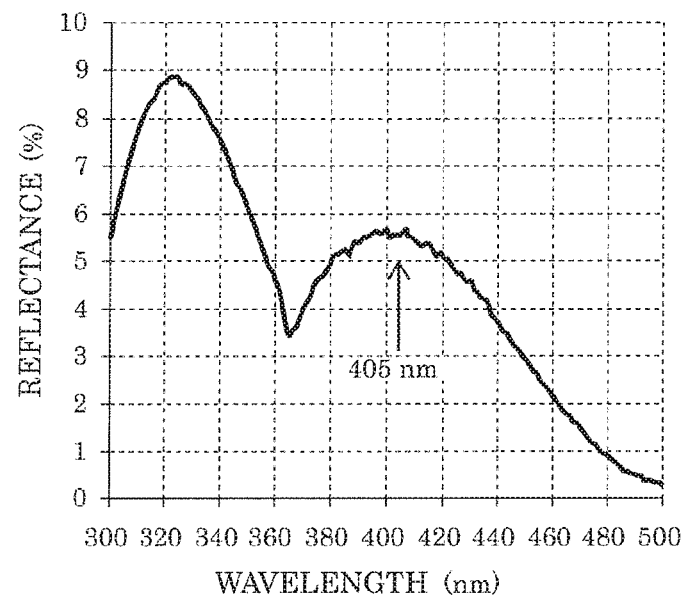
FIG. 9A is a graph showing a reflectance spectrum of the protective film on the emission surface side according to Embodiment 1.
Figure 9B:
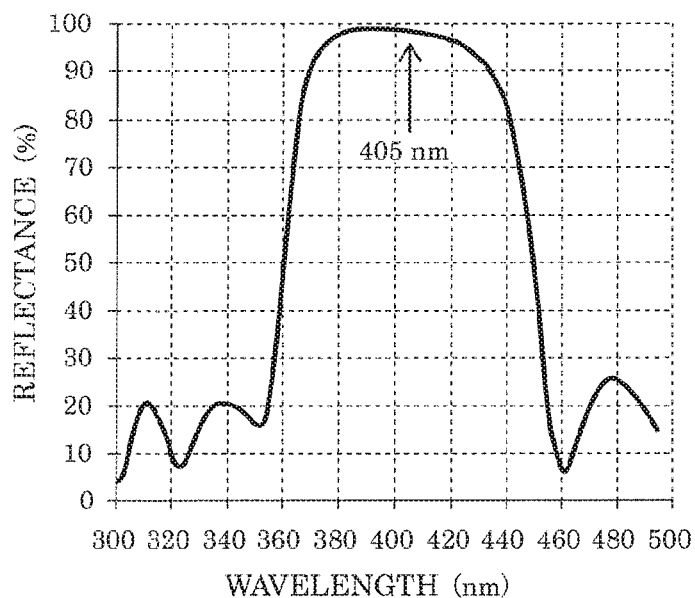
FIG. 9B is a graph showing a reflectance spectrum of the protective film on the reflective surface side according to Embodiment 1.

The reflectance spectrum of the protective film actually manufactured based on the above-described design principle will be described with reference to FIG. 9A and FIG. 9B. FIG. 9A and FIG. 9B are graphs showing reflectance spectra of protective film 110 on the emission surface side and protective film 120 on the reflective surface side, respectively, according to the present embodiment.

As illustrated in FIG. 9A and FIG. 9B, each of the protective films was confirmed to have the reflectance as designed.

Under the above-described film forming conditions, protective films were formed on the emission-side end face and the reflective-side end face of the bar-shaped substrate. Then, a dividing groove was formed by using a laser scribing device, and then the element was diced by using a breaking device.

Next, the diced nitride semiconductor laser element 100 was mounted in a 5.6 ø CAN package to be placed in a state in which the characteristics can be evaluated.

When the current-light output characteristics of nitride semiconductor laser element 100 manufactured according to the procedure as described above were measured, it was confirmed that the characteristics as designed were obtained. In addition, the above-described element was aged under the accelerated aging conditions including the continuous oscillation, the output of 1.4 W, and the temperature of 25 degrees Celsius. As a result, neither sudden death nor significant deterioration of nitride semiconductor laser element 100 was observed.

Embodiment 2

A nitride semiconductor laser element according to Embodiment 2 will be described.

Figure 10:
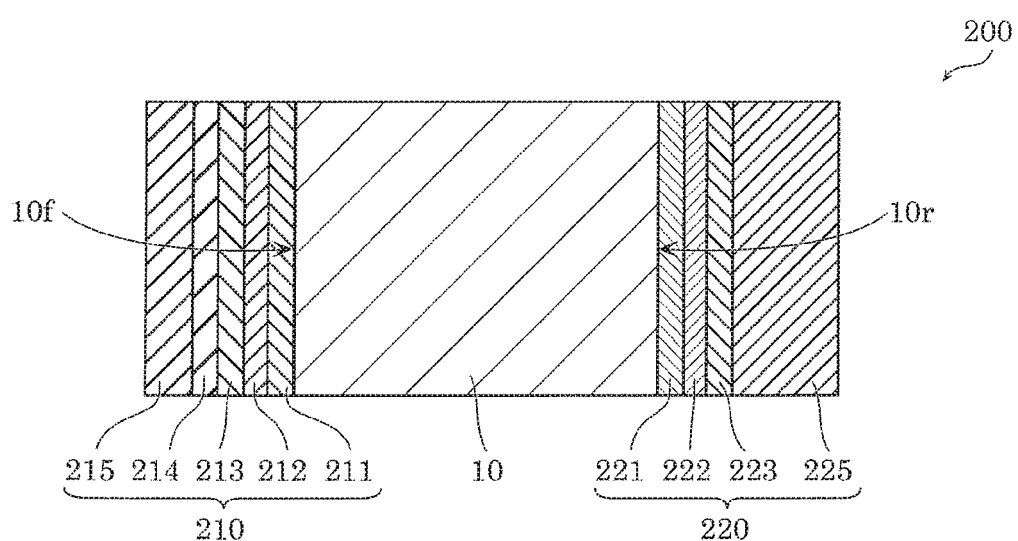
FIG. 10 is a schematic cross-sectional view illustrating the structure of a nitride semiconductor laser element according to Embodiment 2, taken in the direction parallel to the resonator direction.

In order to further improve the durability of the protective film, the nitride semiconductor laser element according to the present embodiment has a structure in which a fourth protective film is added, for the purpose of strengthening the suppression of oxygen diffusion, above the stacked structure including the first protective film, the second protective film, and the third protective film according to Embodiment 1, and further a reflectance adjusting layer is stacked above the fourth protective film. According to the present embodiment, the protective film that has the above-described structure is applied to the emission-side end face for which higher durability is required. Hereinafter, the protective film according to the present embodiment will be described with reference to FIG. 10. FIG. 10 is a schematic cross-sectional view illustrating the structure of nitride semiconductor laser element 200 according to the present embodiment, taken in a direction parallel to a resonator direction.

More specifically, as illustrated in FIG. 10, nitride semiconductor laser element 200 according to the present embodiment includes protective films 210 and 220 each of which includes a dielectric body. Protective films 210 and 220 are disposed on the pair of resonator end faces 10f and 10r, respectively. On resonator end face 10f located on the emission side, first emission surface protective film 211, second emission surface protective film 212, third emission surface protective film 213, fourth emission surface protective film 214, and an emission surface reflectance adjusting layer 215 are disposed in stated order from the stacked structure 10 side.

In addition, on resonator end face 10r located on the reflective side, first reflective surface protective film 221, second reflective surface protective film 222, third reflective surface protective film 223, and reflective surface reflectance adjusting layer 225 are disposed in stated order from the stacked structure 10 side.

On the emission side, first emission surface protective film 211 is a first protective film including amorphous nitride or amorphous oxynitride, second emission surface protective film 212 is a second protective film including a crystalline film containing aluminum nitride or aluminum oxynitride, and third emission surface protective film 213 is a third protective film including amorphous metal oxide or amorphous metal oxynitride. Fourth emission surface protective film 214 is a fourth protective film that includes nitride or oxynitride and is disposed between the third protective film and the reflectance adjusting layer. According to the present embodiment, fourth emission surface protective film 214 includes a crystalline film containing aluminum nitride or aluminum oxynitride. In addition, emission surface reflectance adjusting layer 215 is a reflectance adjusting layer in which the outermost surface includes oxide. In this manner, by forming the outermost surface of protective film 210 with oxide, it is possible to suppress the reflectance fluctuation of the protective film due to the surface reaction with oxygen contained in the external air. Accordingly, it is possible to further suppress the deterioration of the resonator end face.

On the reflective side, first reflective surface protective film 221 is a first protective film including amorphous nitride or amorphous oxynitride, second reflective surface protective film 222 is a second protective film including a crystalline film containing aluminum nitride or aluminum oxynitride, and third reflective surface protective film 223 is a third protective film including amorphous metal oxide or amorphous metal oxynitride. In addition, reflective surface reflectance adjusting layer 225 is a reflectance adjusting layer in which the outermost surface includes oxide. In this manner, by forming the outermost surface of protective film 220 with oxide, it is possible to suppress the reflectance fluctuation of the protective film due to the surface reaction with oxygen contained in the external air. Accordingly, it is possible to further suppress the deterioration of the resonator end face.

Second emission surface protective film 212, fourth emission surface protective film 214, and second reflective surface protective film 222, which are crystalline films, are hexagonal polycrystalline films, and have a crystal structure in which the c-axis is oriented in the normal direction of resonator end faces 10f and 10r.

On the emission side, for example, the Ar atom concentration contained in the first emission surface protective film (hereinafter, also referred to as "Ar atom concentration of the first emission surface protective film") is less than 1%, and the Ar atom concentration contained in the second emission surface protective film and the fourth emission surface protective film is less than 1%, and the Ar atom concentration contained in the third emission surface protective film is greater than or equal to 1% and less than 3%.

In addition, on the reflective side, for example, the Ar atom concentration of the first reflective surface protective film is less than 1%, the Ar atom concentration of the second reflective surface protective film is less than 1%, and the Ar atom concentration of the third reflective surface protective film is greater than or equal to 1% and less than 3%.

According to the present embodiment, on the emission side, the total film thickness of first emission surface protective film 211 and second emission surface protective film 212 and the film thickness of fourth emission surface protective film 214 are less than 50 nm, for example. On the reflective side, the total film thickness of first reflective surface protective film 221 and second reflective surface protective film 222 is, for example, less than 50 nm.

With the structure described above, it is possible to further reduce the diffusion of oxygen from the outside as compared with the structure of Embodiment 1, and as a result, it is possible to yield the advantageous effect that the durability of the protective film can be improved.

In addition, by adding the fourth protective film, it is possible to suppress the degassing reaction from the first to third protective films located closer to the resonator end face than the fourth protective film, thereby suppressing the fluctuations in reflectance and film peeling on the resonator end face. As a result, it is possible to improve the durability of the protective film.

In this example, the end face protective film was formed under the film forming conditions indicated in the table below.

TABLE 2

|  | First protective film | Second protective film | Third protective film | Fourth protective film |
|---|---|---|---|---|
| Material | Amorphous SiN film | Crystalline AlN film | Amorphous $Al_2O_3$ film | Crystalline AlN film |
| Ar flow rate | 5 sccm | 30 sccm | 20 sccm | 30 sccm |
| $N_2$ flow rate | 20 sccm | 5 sccm | — | 5 sccm |
| $O_2$ flow rate | — | — | 4 sccm | — |
| Microwave power | 500 W | 500 W | 500 W | 500 W |
| RF power | 500 W | 500 W | 500 W | 500 W |
| Film thickness (emission surface) | 2 nm | 11 nm | 13 nm | 10 nm |
| Film thickness (reflective surface) | 2 nm | 8 nm | 140 nm | Non |

Subsequently, a reflectance adjusting layer was formed above the fourth protective film to adjust the reflectance on the emission side and the reflective side.

More specifically, the film type (refractive index), the film thickness, and the number of stacked layers were designed such that the reflectance on resonator end face 10f on the emission side is 15.0% at the wavelength of 450 nm which is the oscillation wavelength of nitride semiconductor laser element 200, and that the reflectance has a maximum value at the above-described wavelength. On the reflective side, the film type (refractive index), the film thickness, and the number of stacked layers were designed such that the reflectance is 97% at the wavelength of 450 nm which is the oscillation wavelength, and that the reflectance has a maximum value at the above-described wavelength.

Under the above-described film forming conditions, protective films were formed on the emission-side end face and the reflective-side end face of the bar-shaped substrate. Then, a dividing groove was formed by using a laser scribing device, and then the element was diced by using a breaking device.

Next, the diced nitride semiconductor laser element 200 was mounted in a 9 ø CAN package to be placed in a state in which the characteristics can be evaluated.

When the current-light output characteristics of nitride semiconductor laser element 200 manufactured by the procedure as described above were measured, it was confirmed that the characteristics as designed were obtained.

In addition, the above-described element was aged under the accelerated aging conditions including the continuous oscillation, the output of 2.0 W, and the temperature of 25 degrees Celsius. As a result, neither sudden death nor significant deterioration of the nitride semiconductor laser element was observed.

Figure 11A:
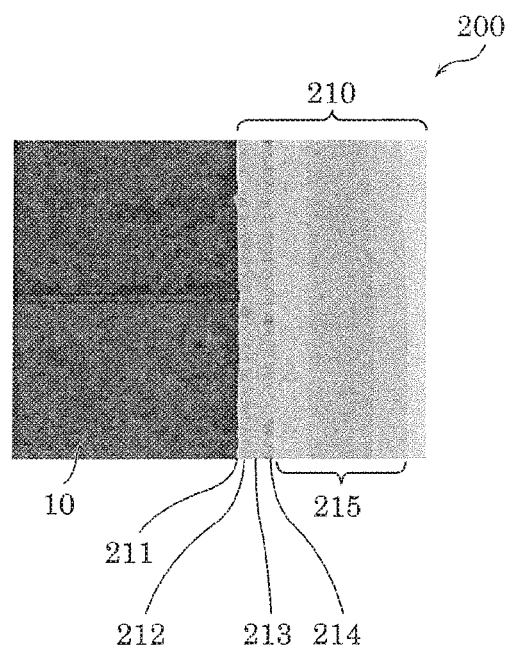
FIG. 11A is a cross-sectional TEM photograph illustrating the state of deterioration of the protective film according to Embodiment 2 after aging.
Figure 11B:
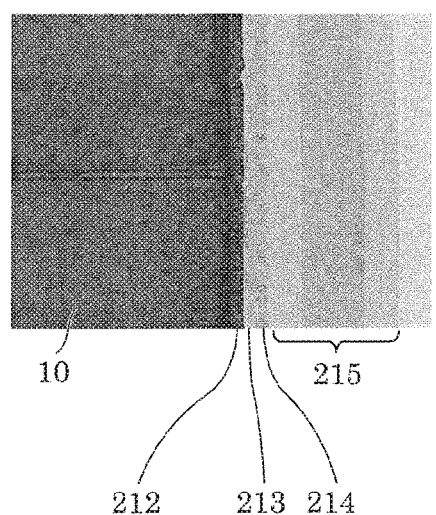
FIG. 11B is a cross-sectional TEM photograph illustrating the state of deterioration of the protective film of the second comparative example after aging.

Next, the deterioration state of nitride semiconductor laser element 200 according to the present embodiment after aging will be described with reference to FIG. 11A and FIG. 11B. FIG. 11A and FIG. 11B are cross-sectional TEM photographs respectively showing deterioration states of the protective films of Embodiment 2 and the second comparative example after aging.

FIG. 11A illustrates protective film 210 formed on resonator end face 10f on the emission side according to the present embodiment. Protective film 210 includes first emission surface protective film 211 including SiN, second emission surface protective film 212 including crystalline AlN, third emission surface protective film 213 including $Al_2O_3$, fourth emission surface protective film 214 including crystalline AlN, and emission surface reflectance adjusting layer 215 including $SiO_2/Al_2O_3/SiO_2$ in stated order from the resonator end face 10f side.

In addition, FIG. 11B illustrates a protective film on the resonator end face on the emission side of the second comparative example. The stacked structure of the protective film is a structure in which first emission surface protective film 211 is removed from protective film 210 according to the present embodiment. In other words, the protective film includes second emission surface protective film 212 including crystalline AlN, third emission surface protective film 213 including $Al_2O_3$, fourth emission surface protective film 214 including crystalline AlN, and emission surface reflectance adjusting layer 215 including $SiO_2/Al_2O_3/SiO_2$ in stated order from the resonator end face 10f side on the emission side.

It should be noted that the cross-sectional TEM photographs of the second protective film and the fourth protective film in FIG. 11A and FIG. 11B are similar to the cross-sectional TEM photograph of the second protective film illustrated in FIG. 2A, and thus the second protective film and the fourth protective film illustrated in FIG. 11A and FIG. 11B each have a film quality similar to the film quality of the second protective film illustrated in FIG. 2A.

In FIG. 11B illustrating the protective film of the second comparative example, the contrast of the $Al_2O_3$ film is partially changed in second emission surface protective film 212 and emission surface reflectance adjusting layer 215, which indicates that the $Al_2O_3$ layer has been crystallized.

On the other hand, in FIG. 11A illustrating protective film 210 according to the present embodiment, the contrast of the $Al_2O_3$ film is uniform in third emission surface protective film 213 and emission surface reflectance adjusting layer 215, and thus it is considered that no crystallization has occurred.

When the $Al_2O_3$ film is photo-crystallized, the film thickness and the refractive index are slightly changed, and thus the reflectance is also slightly changed. It is concerned that this may affect the optical output of the laser.

In terms of the effect of the photo-crystallization of the $Al_2O_3$ film, the oxygen permeation suppression function is strong when the entire film is crystallized. However, the oxygen permeation suppression function is insufficient when the film is partially crystallized as indicated in FIG. 11B, and it is considered that the disadvantages associated with the above-described change in reflectance are rather significant.

Figure 12:
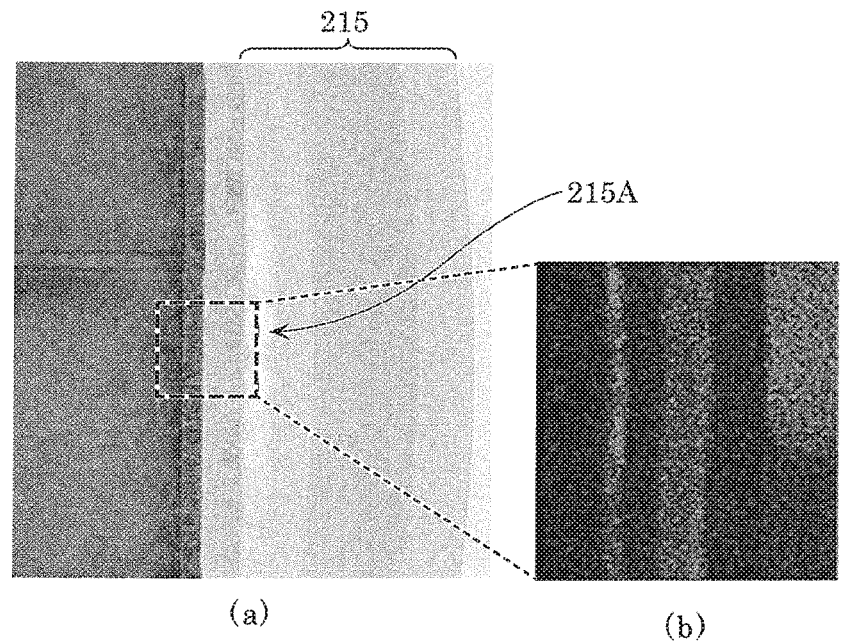
FIG. 12 is a diagram illustrating an emission surface reflectance adjusting layer in which a deterioration phenomenon has occurred.

In protective film 210 according to the present embodiment, deterioration of emission surface reflectance adjusting layer 215 was not observed under the above-described aging conditions (i.e., the continuous oscillation, the output of 2.0 W, and the temperature of 25 degrees Celsius), as indicated in FIG. 11A. It has been clarified, however, that the deterioration phenomenon of emission surface reflectance adjusting layer 215 appears when aging with a further overload is performed. Such a deterioration phenomenon will be described with reference to FIG. 12. FIG. 12 is a diagram illustrating emission surface reflectance adjusting layer 215 in which a deterioration phenomenon has occurred.

In the cross-sectional TEM photograph (a) of FIG. 12, protective film 210 in which the film expansion of emission surface reflectance adjusting layer 215 has occurred is illustrated. The aging conditions for the nitride semiconductor laser element illustrated in FIG. 12 include the continuous oscillation, the output of 2.0 W, and the temperature 85 degrees Celsius.

In addition, the mapping diagram (b) of FIG. 12 is a diagram indicating the result of Ar element mapping of a bubble-state altered region (a region inside a broken line frame of the cross-sectional TEM photograph (a) of FIG. 12) generated due to film expansion, carried out by using an energy dispersive X-ray spectroscopy (EDX) method. The white portion of the mapping diagram (b) indicates that the Ar atom concentration is high, and the black portion of the mapping diagram (b) indicates that the Ar atom concentration is low.

As is clear from FIG. 12, the density of Ar element is high in film expansion region 215A which is in a bubble state.

According to this result, it can be considered that the mechanism of occurrence of film expansion is due to migration and cohesion of Ar in the protective film under the environment of a high temperature and a high optical density. It is thus considered that the film expansion can be controlled by precisely controlling the Ar atom concentration in the reflectance adjusting layer.

The Ar atom concentration of the reflectance adjusting layer can be controlled by the Ar flow rate during film formation. For example, the Ar atom concentration in the film is 3.5 at % when the $Al_2O_3$ film is formed under the film forming condition of the Ar flow rate of 30 sccm. However, it is possible to reduce the Ar atom concentration in the film to 1.0 at % by reducing the Ar flow rate to 10 sccm.

The Ar atom concentration of emission surface reflectance adjusting layer 215 in the protective film illustrated in FIG. 12 is 3.5 at %. Since film expansion can occur under this condition, it is possible to suppress the film expansion by reducing the Ar atom concentration to be lower than 3.5 at %. Further, the Ar atom concentration may be less than 3 at %.

Further, in the stacked film of the reflectance adjusting layer, the film in contact with the fourth protective film has a high temperature due to the influence of the light absorption and heat generation of the fourth protective film, and thus the film expansion is more likely to occur. It is thus possible to further suppress the film expansion by setting the Ar atom concentration of the film in contact with the fourth protective film included in the stacked film of the reflectance adjusting layers to be less than 2 at %.

The structure of the present embodiment is not limited to the above-described structure. For example, also in the case where a protective film according to a variation of the present embodiment has a stacked structure in which a first emission surface protective film is SiON having a film thickness of 2 nm, a second emission surface protective film is AlON having a film thickness of 6 nm, a third emission surface protective film is $Al_2O_3$ having a film thickness of 6 nm, a fourth emission surface protective film is AlON having a film thickness of 6 nm, and the emission surface reflectance adjusting layer including $Al_2O_3$ having a film thickness of 116 nm and $SiO_2$ having a film thickness of 16 nm are stacked in stated order, it was possible to obtain a highly reliable nitride semiconductor laser element.

Embodiment 3

Next, a protective film according to Embodiment 3 will be described below. In this embodiment, a protective film manufactured by using only $N_2$ gas without using Ar gas in forming the first protective film will be described.

The stacked structure illustrated in FIG. 10 is adopted as the stacked structure of the protective film according to the present embodiment. In addition, an amorphous SiN film is adopted as the first protective film, and the film forming conditions were as indicated in the table below.

TABLE 3

| | First protective film |
|---|---|
| Material | Amorphous SiN film |
| Ar flow rate | 0 sccm |
| $N_2$ flow rate | 40 sccm |
| Microwave power | 500 W |
| RF power | 500 W |
| Film thickness (emission surface) | 2 nm |
| Film thickness (reflective surface) | 2 nm |

The film forming conditions of the second, third, and fourth protective films on the emission side were the same as film forming conditions in the second embodiment. In addition, the structure and film forming conditions of the protective film on the reflective side were the same as the structure and film forming conditions of protective film 120 of Embodiment 1. According to the present embodiment, the reflectance adjusting layer was also formed under a film forming condition with a low Ar atom concentration, and the Ar atom concentration in the film was set to 2.0 at %.

Under the above-described film forming conditions, protective films were formed on the emission-side end face and the reflective-side end face of the bar-shaped substrate. Then, a dividing groove was formed by using a laser scribing device, and then the element was diced by using a breaking device.

Next, the diced nitride semiconductor laser element was mounted in a 9 ø CAN package to be placed in a state in which the characteristics can be evaluated.

When the current-light output characteristics of the nitride semiconductor laser element manufactured by the procedure as described above were measured, it was confirmed that the characteristics as designed were obtained.

In addition, the above-described element was aged under the accelerated aging conditions including the continuous oscillation, the output of 2.0 W, and the temperature of 85 degrees Celsius. As a result, neither sudden death nor significant deterioration of the nitride semiconductor laser element was observed.

Embodiment 4

Next, a protective film according to Embodiment 4 will be described below. In the protective film according to the present embodiment, in order to further improve the durability, the film thicknesses of first emission surface protective film 211 and first reflective surface protective film 221 are set to be less than the film thicknesses of protective films 210 and 220 according to Embodiment 2. Hereinafter, the protective film according to the present embodiment will be described focusing on the differences from the protective film according to Embodiment 2.

The stacked structure illustrated in FIG. 10 is adopted as the structure of the protective film according to the present embodiment, in the same manner as protective films 210 and 220 according to Embodiment 2. In addition, an amorphous SiN film is adopted as the first protective film. The following table indicates one example of film forming conditions from the first protective film to the fourth protective film of the protective film according to the present embodiment.

TABLE 4

|  | First protective film | Second protective film | Third protective film | Fourth protective film |
|---|---|---|---|---|
| Material | Amorphous SiN film | Crystalline AlN film | Amorphous $Al_2O_3$ film | Crystalline AlN film |
| Ar flow rate | 5 sccm | 30 sccm | 20 sccm | 30 sccm |
| $N_2$ flow rate | 20 sccm | 5 sccm | — | 5 sccm |
| $O_2$ flow rate | — | — | 4 sccm | — |
| Microwave power | 500 W | 500 W | 500 W | 500 W |
| RF power | 500 W | 500 W | 500 W | 500 W |
| Film thickness (emission surface) | 0.5 nm | 11 nm | 13 nm | 10 nm |
| Film thickness (reflective surface) | 0.5 nm | 8 nm | 140 nm | Non |

In the film forming conditions of the example indicated in the above table, the film thickness of the first protective film is 0.5 nm, and only this film thickness is different from the film forming conditions of protective films 210 and 220 according to Embodiment 2.

A reflectance adjusting layer was formed above the fourth protective film formed in the above-described manner to adjust the reflectance on the emission side and the reflectance on the reflective side. More specifically, the film type (refractive index), the film thickness, and the number of stacked layers were designed such that the reflectance on resonator end face 10f on the emission side is 5.0% at the wavelength of 405 nm which is the oscillation wavelength of nitride semiconductor laser element, and that the reflectance has a maximum value at the above-described wavelength. On the reflective side, the film type (refractive index), the film thickness, and the number of stacked layers were designed such that the reflectance is 97% at the wavelength of 405 nm which is the oscillation wavelength, and that the reflectance has a maximum value at the above-described wavelength.

Figure 13:
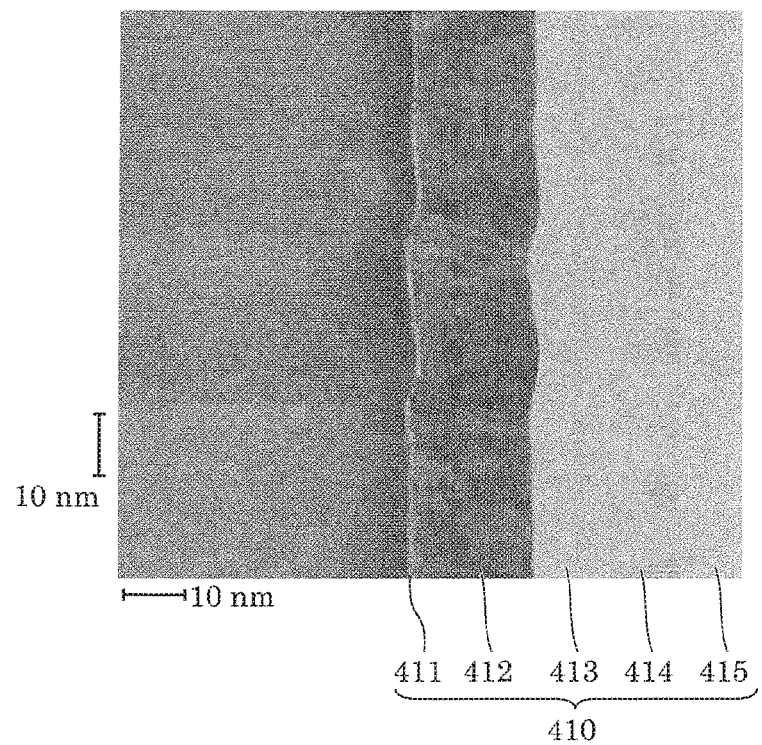
FIG. 13 is a cross-sectional TEM photograph of a protective film on the emission side according to Embodiment 4.

Under the above-described film forming conditions, protective films were formed on the emission-side end face and the reflective-side end face of the bar-shaped substrate. The structure of these protective films will be described with reference to FIG. 13. FIG. 13 is a cross-sectional TEM photograph of protective film 410 on the emission side according to the present embodiment. The cross-sectional TEM photograph illustrated in FIG. 13 is a TEM bright-field image obtained by observing a cross section of protective film 410 stacked on the resonator end face on the emission side of the bar-shaped substrate at a magnification of 2 million times. As illustrated in FIG. 13, protective film 410 includes first emission surface protective film 411, second emission surface protective film 412, third emission surface protective film 413, fourth emission surface protective film 414, and emission surface reflectance adjusting layer 415.

First emission surface protective film 411 is one example of the first protective film according to the present embodiment, and is an amorphous SiN film having a film thickness of 0.5 nm. Second emission surface protective film 412 is one example of the second protective film according to the present embodiment, and is a crystalline AlN film. Third emission surface protective film 413 is one example of the third protective film according to the present embodiment, and is an amorphous $Al_2O_3$ film. Fourth emission surface protective film 414 is one example of the fourth protective film according to the present embodiment, and is a crystalline AlN film. Emission surface reflectance adjusting layer 415 is one example of the reflectance adjusting layer according to the present embodiment.

It should be noted that, the cross-sectional TEM photograph of fourth emission surface protective film 414 illustrated in FIG. 13 is similar to the cross-sectional TEM photograph of second emission surface protective film 12 illustrated in FIG. 2A, and thus fourth emission surface protective film 414 illustrated in FIG. 13 has a film quality similar to the film quality of second emission surface protective film 12 illustrated in FIG. 2A.

In addition, in FIG. 13, regarding the orientation of second emission surface protective film 412, although a region having other orientations such as the m-axis orientation is included, second emission surface protective film 412 mostly has the c-axis orientation corresponding to the normal direction of the resonator end face.

In addition, as illustrated in FIG. 13, the AlN film of second emission surface protective film 412 and the AlN film of fourth emission surface protective film 414 have different contrasts in the bright field image of the TEM, and the AlN film of second emission surface protective film 412 is darker than the AlN film of fourth emission surface protective film 414. The difference in the contrast in the TEM corresponds to the difference in the intensity of the transmitted electron beam, and it is indicated that the crystallinity and the density of the AlN film of the second emission surface protection film 412 are higher than the crystallinity and the density of the AlN film of fourth emission surface protection film 414.

A dividing groove was formed on the bar-shaped substrate on which the protective film as described above is disposed, by using a laser scribing device, and then the bar-shaped substrate was diced by using a breaking device to form a nitride semiconductor laser element.

Next, the diced nitride semiconductor laser element was mounted in a 9 ø CAN package to be placed in a state in which the characteristics can be evaluated.

When the current-light output characteristics of the nitride semiconductor laser element manufactured by the procedure as described above were measured, it was confirmed that the characteristics as designed were obtained.

Next, an aging test was performed on the nitride semiconductor laser element according to the present embodiment. In order to confirm the advantageous effect of the nitride semiconductor laser element according to the present embodiment, a similar accelerated aging test was performed on nitride semiconductor laser element 100 according to Embodiment 1, and the results of the present embodiment and Embodiment 1 were compared.

The aging conditions according to the present embodiment were more severe than the aging conditions used in Embodiment 1, and the aging was performed under the accelerated aging conditions including the continuous oscillation, the output of 2.0 W, and the temperature of 25 degrees Celsius. As a result, in nitride semiconductor laser element 100 generated in Embodiment 1, sudden death of an element was observed approximately 100 hours. However, in the nitride semiconductor laser element generated in the present embodiment, sudden death or significant deterioration was not observed. Such improvement in the reliability of the nitride semiconductor laser element according to the present embodiment is considered to be resulting from the oxygen diffusion being suppressed and the deterioration of the resonator end face being further suppressed in the second protective film in accordance with the improvement of the crystallinity or the increase in the density of the second protective film.

As a result of repeatedly performing experiments similar to the above-described experiments and investigations, it has been found that the reliability of the nitride semiconductor laser element can be significantly improved by setting the film thickness of the first protective film to be larger than 0 nm and smaller than 1 nm. In addition, in order to further improve the reliability of the nitride semiconductor laser element, the film thickness of the first protective film may be set to be greater than or equal to 0.2 nm and less than 0.8 nm.

In addition, also in regard to the reflectance adjusting layer, a similar investigation was conducted for various film structures. As a result, it was confirmed that excellent reliability can be obtained in each of the cases where a $SiO_2$ single layer structure, a two-layer structure of $Al_2O_3/SiO_2$, and a three-layer structure of $SiO_2/Al_2O_3/SiO_2$, $SiO_2/AlON/SiO_2$, $SiO_2/AlN/SiO_2$, $SiO_2/SiN/SiO_2$, or $SiO_2/SiON/SiO_2$ is used as the reflectance adjusting layer.

The structure of the present embodiment is not limited to the above-described structure. For example, also in the case where a protective film according to a variation of the present embodiment has a stacked structure in which a first emission surface protective film is SiN having a film thickness of 0.5 nm, a second emission surface protective film is AlON having a film thickness of 20.5 nm, a third emission surface protective film is $Al_2O_3$ having a film thickness of 13 nm, a fourth emission surface protective film is AlON having a film thickness of 11 nm, and the emission surface reflectance adjusting layer including $SiO_2$ having a film thickness of 79 nm, $Al_2O_3$ having a film thickness of 84 nm, and $SiO_2$ having a film thickness of 79 nm are stacked in stated order, a highly reliable nitride semiconductor laser element was able to be obtained.

Embodiment 5

Figure 14:
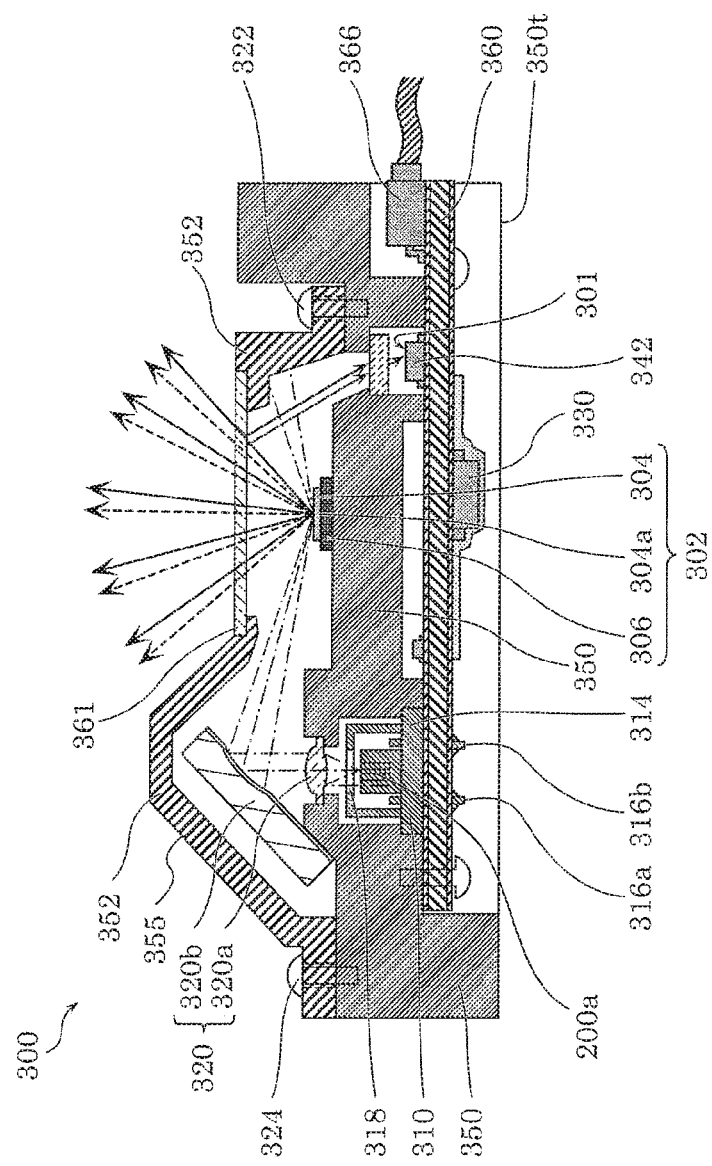
FIG. 14 is a schematic cross-sectional view illustrating the structure of the illumination light source module according to Embodiment 5.

An illumination light source module according to Embodiment 5 will be described with reference to FIG. 14. The illumination light source module according to the present embodiment is an illumination light source module that includes a nitride semiconductor laser element. FIG. 14 is a schematic cross-sectional view illustrating the structure of illumination light source module 300 according to the present embodiment.

As illustrated in FIG. 14, illumination light source module 300 includes, for example, semiconductor light emitting device 310 on which nitride semiconductor laser element 200a according to Embodiment 3 is mounted, external connection member 366 for supplying electric power to semiconductor light emitting device 310 from the outside, state detection circuit 301 including light receiving element 342 and the like, and transistor 330 connected to semiconductor light emitting device 310.

Semiconductor light emitting device 310 is configured by mounting nitride semiconductor laser element 200a on TO-CAN package 314 including lead pins 316a and 316b, and covering the portion in which nitride semiconductor laser element 200a is mounted, by a metal can including light transmitting member 318 such as glass. Nitride semiconductor laser element 200a is electrically connected to lead pins 316a and 316b with a not-illustrated metal wire or the like.

State detection circuit 301 is an operation state detection circuit that detects the operation state of illumination light source module 300 and outputs an operation state signal. According to the present embodiment, state detection circuit 301 includes light receiving element 342, a resistor, etc., and detects a physical quantity related to the spectrum or the light quantity of the emission light emitted from semiconductor light emitting device 310 as the operating state of illumination light source module 300.

Transistor 330 is connected to semiconductor light emitting device 310, and adjusts the amount of current applied to semiconductor light emitting device 310 according to the operation state signal from state detection circuit 301.

Illumination light source module 300 according to the present embodiment further includes mounting board 360. Mounting board 360 is a printed board including an insulating board including glass epoxy, ceramics, or the like, and printed wiring that includes, for example, copper foil, and is formed on the insulating board. Semiconductor light emitting device 310, external connection member 366, state detection circuit 301, and transistor 330 are mounted on mounting substrate 360.

Furthermore, Illumination light source module 300 according to the present embodiment includes base 350 including, for example, an aluminum alloy. Mounting board 360 and semiconductor light emitting device 310 are fixed to base 350. When illumination light source module 300 according to the present embodiment is used to configure a light projecting device, base 350 of illumination light source module 300 according to the present embodiment includes first surface 350t which is a fixing surface for fixing to an external device such as an external heat dissipator such as a heat sink which is not illustrated, a housing of the light projecting device, etc. According to the present embodiment, mounting board 360 is disposed on the fixed surface of a portion recessed inward by one step from first surface 350t of base 350. In the present embodiment, mounting board 360 is disposed parallel to first surface 350t.

According to the present embodiment, illumination light source module 300 further includes wavelength conversion element 302 that absorbs a portion of light emitted from semiconductor light emitting device 310 and emits light that has been changed according to the spectrum and the amount of light. In wavelength conversion element 302, for example, wavelength conversion member 304 including a phosphor such as yttrium-aluminum-garnet (YAG) type phosphor is formed on support member 306 in which a reflective film is formed on a high thermal conductivity substrate, for example.

Illumination light source module 300 according to the present embodiment further includes light collection optical member 320 that collects the emitted light emitted from semiconductor light emitting device 310 on light emitter 304a which is a local region of wavelength conversion member 304. According to the present embodiment, light collection optical member 320 includes lens 320a which is, for example, a collimator lens, and reflective optical element 320b which is, for example, a glass substrate including a concave lens and a reflective film that are formed on a surface. Light collection optical member 320 and wavelength conversion element 302 are disposed on base 350. At this time, light collection optical member 320 and wavelength conversion element 302 are fixed to the surface of base 350 opposite to the surface on which first surface 350t is formed. Then, light collection optical member 320 and wavelength conversion element 302 are covered with cover unit 355 including light transmitting member 361 and holding member 352. According to the present embodiment, cover unit 355 is fixed to base 350 with screws 322 and 324.

The structure of the illumination light source module according to the present embodiment has been described above.

Figure 15:
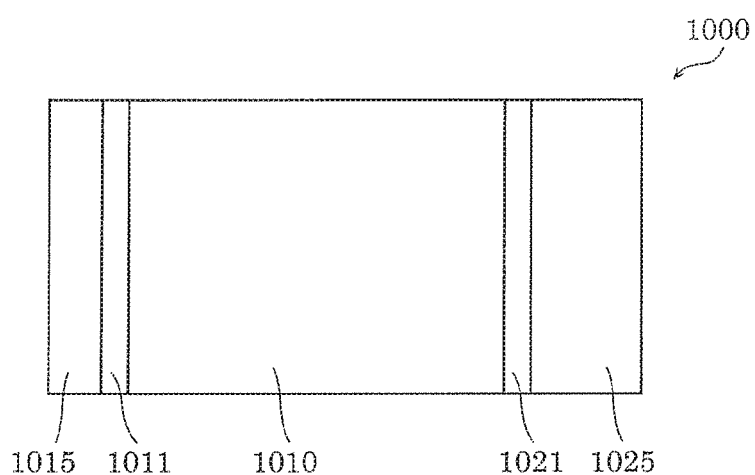
FIG. 15 is a cross-sectional view illustrating the structure of the protective film on the resonator end face of the conventional semiconductor laser element, taken in the direction parallel to the resonator direction.

Here, according to the present embodiment, semiconductor light emitting device 310 including nitride semiconductor laser element 200a of Embodiment 3 mounted therein is employed, and reliability has been compared with the case where nitride semiconductor laser element 1000 having the structure of the conventional example illustrated in FIG. 15 is mounted. Hereinafter, the results of the reliability test of illumination light source module 300 according to the present embodiment will be described.

The reliability test was carried out under the conditions including an initial luminous flux of 500 lm and a module temperature of 85 degrees Celsius. As a result of the reliability test, the luminous flux deterioration rate after 2500 hours of operation was 20% in the illumination light source module which includes nitride semiconductor laser element 1000 having the structure of the conventional example, whereas the luminous flux deterioration rate after 2500 hours of operation was 15% in illumination light source module 300 which includes nitride semiconductor laser element 200a manufactured in Embodiment 3. As described above, according to illumination light source module 300, since the nitride semiconductor laser element capable of suppressing the deterioration of the resonator end face even in a high-power operation in which the optical output is greater than or equal to 1 W is included, it is possible to achieve high reliability and durability.

Although nitride semiconductor laser element 200a according to Embodiment 3 is employed for illumination light source module 300 of the present embodiment, the nitride semiconductor laser element according to Embodiment 1 or Embodiment 2 may be employed.

Variation, Etc

Although nitride semiconductor laser element according to the present disclosure has been described based on the exemplary embodiments thus far, the present disclosure is not limited to the exemplary embodiments described above.

For example, in each of the above-described embodiments, although the protective film is disposed on both the pair of resonator end faces 10f and 10r, it is sufficient that the protective film is disposed on at least one of the pair of resonator end faces.

In addition, although the fourth protective film is disposed only on protective film 210 on the emission side according to Embodiment 2 described above, the fourth protective film may be additionally provided on protective film 220 on the reflective side.

In addition, although the example in which the protective film contains Ar as the noble gas has been indicated in each of the embodiments described above, the noble gas contained in the protective film is not limited to Ar, and other noble gas may be used.

In addition, forms obtained by various modifications to the respective exemplary embodiments described above that can be conceived by a person of skill in the art as well as forms realized by arbitrarily combining structural components and functions in the respective exemplary embodiments described above which are within the scope of the essence of the present disclosure are included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The nitride semiconductor laser element according to the present disclosure includes an end face protective film that is less likely to deteriorate even in a high-power operation, and is useful as a nitride semiconductor laser element having a long life and high reliability.

What is claimed is:

1. A nitride semiconductor laser element, comprising:
a stacked structure including a plurality of semiconductor layers including a light emitting layer, the stacked structure including a pair of resonator end faces located on opposite ends; and
a protective film including a dielectric body and disposed on at least one of the pair of resonator end faces, wherein:
the protective film includes a first protective film, a second protective film, and a third protective film disposed in stated order above the stacked structure,
the first protective film is amorphous,
the second protective film is crystalline,
the third protective film is amorphous,
the protective film further includes a reflectance adjusting layer disposed above the third protective film and including at least one dielectric film, and
the at least one dielectric film included in the reflectance adjusting layer includes an amorphous oxide film having a noble gas atom concentration less than 3 atomic percent.

2. The nitride semiconductor laser element according to claim 1, wherein
the second protective film is an aluminum nitride film or an aluminum oxynitride film each of which includes a hexagonal polycrystalline film having a c-axis orientation normal to the at least one of the pair of resonator end faces.

3. The nitride semiconductor laser element according to claim 2, wherein
the aluminum nitride film or the aluminum oxynitride film includes a crystal having an orientation different from the c-axis orientation.

4. The nitride semiconductor laser element according to claim 2, wherein
the aluminum nitride film or the aluminum oxynitride film includes an amorphous portion.

5. The nitride semiconductor laser element according to claim 1, wherein
a total film thickness of the first protective film and the second protective film is less than 50 nm.

6. The nitride semiconductor laser element according to claim 1, wherein
a film thickness of the first protective film is less than 1.0 nm.

7. The nitride semiconductor laser element according to claim 1, wherein
the first protective film is an amorphous film containing silicon nitride or silicon oxynitride.

8. The nitride semiconductor laser element according to claim 1, wherein
the third protective film is an amorphous film containing aluminum oxide or aluminum oxynitride.

9. The nitride semiconductor laser element according to claim 1, wherein
the first protective film and the second protective film each have a noble gas atom concentration less than 1 atomic percent, and
the third protective film has a noble gas atom concentration greater than or equal to 1 atomic percent and less than 3 atomic percent.

10. The nitride semiconductor laser element according to claim 1, wherein
the second protective film has a noble gas atom concentration less than a noble gas atom concentration of the first protective film.

11. The nitride semiconductor laser element according to claim 1, wherein
the first protective film has a noble gas atom concentration less than a noble gas atom concentration of the third protective film.

12. The nitride semiconductor laser element according to claim 1, wherein
the second protective film has a noble gas atom concentration less than a noble gas atom concentration of the third protective film.

13. The nitride semiconductor laser element according to claim 1, wherein
the protective film further includes a fourth protective film disposed between the third protective film and the reflectance adjusting layer, the fourth protective film containing nitride or oxynitride.

14. The nitride semiconductor laser element according to claim 13, wherein
the fourth protective film is a hexagonal polycrystalline film containing aluminum nitride or aluminum oxynitride, and
a crystal orientation of the fourth protective film is a c-axis orientation normal to the at least one of the pair of resonator end faces.

15. The nitride semiconductor laser element according to claim 13, wherein
the fourth protective film has a noble gas atom concentration less than 1 atomic percent and a film thickness less than 50 nm.

16. The nitride semiconductor laser element according to claim 1, wherein
the at least one of the pair of resonator end faces has a reflectance that is a maximum value or a minimum value of a reflectance spectrum with respect to a wavelength of laser emitted by the nitride semiconductor laser element.

17. An illumination light source module, comprising:
the nitride semiconductor laser element according to claim 1.

18. The nitride semiconductor laser element according to claim 1, wherein
the second protective film and the first protective film contain different elements from each other.

19. The nitride semiconductor laser element according to claim 1, wherein
the first protective film is an amorphous film containing silicon nitride or silicon oxynitride, and
the second protective film is an aluminum nitride film or an aluminum oxynitride film.

20. A nitride semiconductor laser element, comprising:
a stacked structure including a plurality of semiconductor layers including a light emitting layer, the stacked structure including a pair of resonator end faces located on opposite ends; and
a protective film including a dielectric body and disposed on at least one of the pair of resonator end faces, wherein:
the protective film includes a first protective film, a second protective film, a third protective film disposed in stated order above the stacked structure, a reflectance adjusting layer disposed above the third protective film and including at least one dielectric film, and a fourth protective film disposed between the third protective film and the reflectance adjusting layer,
the first protective film is amorphous,
the second protective film is crystalline,
the third protective film is amorphous,
the fourth protective film contains nitride or oxynitride, and
the at least one dielectric film included in the reflectance adjusting layer includes a dielectric film that is in contact with the fourth protective film, and is an amorphous oxide film having a noble gas atom concentration less than 2 atomic percent.

* * * * *